(12) United States Patent
Moon et al.

(10) Patent No.: US 11,515,848 B2
(45) Date of Patent: Nov. 29, 2022

(54) SOURCE DRIVER HAVING AN OUTPUT BUFFER CIRCUIT WITH SLEW RATE COMPENSATION AND DISPLAY DEVICE THEREOF

(71) Applicant: Samsung Electronics Co., Ltd., Suwon-si (KR)

(72) Inventors: Youngbae Moon, Seongnam-si (KR); Woonyoung Lee, Seongnam-si (KR); Chanbong Yu, Seoul (KR); Yunseok Jang, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/232,762

(22) Filed: Apr. 16, 2021

(65) Prior Publication Data

US 2022/0109415 A1 Apr. 7, 2022

(30) Foreign Application Priority Data

Oct. 6, 2020 (KR) .................. 10-2020-0128520

(51) Int. Cl.
*H03F 3/45* (2006.01)
*H02H 9/04* (2006.01)
*G09G 3/3275* (2016.01)
*G11C 19/00* (2006.01)

(52) U.S. Cl.
CPC ....... *H03F 3/45273* (2013.01); *G09G 3/3275* (2013.01); *H02H 9/046* (2013.01); *G09G 2310/027* (2013.01); *G09G 2310/0286* (2013.01); *G09G 2310/0291* (2013.01); *G09G 2330/021* (2013.01); *G11C 19/00* (2013.01); *H03F 2203/45248* (2013.01)

(58) Field of Classification Search
CPC .................................. H03F 3/45273
USPC ...................................... 345/690
See application file for complete search history.

(56) References Cited

U.S. PATENT DOCUMENTS

| | | |
|---|---|---|
| 7,339,430 B2 | 3/2008 | Chiu |
| 7,863,982 B2 | 1/2011 | Chen et al. |
| 8,599,179 B2 | 12/2013 | Kim et al. |
| 8,648,638 B2 | 2/2014 | Lu |
| 8,933,755 B2 | 1/2015 | Cheng et al. |
| 9,543,912 B2 | 1/2017 | Lee |
| 10,467,973 B2 | 11/2019 | Ko et al. |

(Continued)

*Primary Examiner* — Long D Pham
(74) *Attorney, Agent, or Firm* — Harness, Dickey & Pierce, P.L.C.

(57) ABSTRACT

An output buffer circuit includes an operational amplifier configured to generate an amplifier output voltage signal based on an input voltage signal and on a compensation current, a slew rate compensating circuit configured to generate the compensation current to increase a slew rate of the amplifier output voltage signal based on a difference between the input voltage signal and a feedback voltage signal, an output path circuit connected between the operational amplifier and an output pad, the output path circuit configured to transfer the amplifier output voltage signal to generate a pad output voltage signal through the output pad, and a feedback path circuit, the feedback path circuit connected between the slew rate compensating circuit and a feedback input node that is on the output path circuit, the feedback path circuit configured to generate the feedback voltage signal.

20 Claims, 18 Drawing Sheets

(56) References Cited

U.S. PATENT DOCUMENTS

2015/0084694 A1* 3/2015 Lee .................. H03F 1/483
                                            327/170
2017/0004799 A1   1/2017 Park et al.
2021/0011505 A1*  1/2021 Chien ................ G05F 1/575

* cited by examiner

FIG. 20

|  | RISING TIME | FALLING TIME | PWC1 | PWC2 |
|---|---|---|---|---|
| OBFc | 2.488us | 2.529us | 54.3mW | 247.2mW |
| OBFp | 2.362us | 2.403us | 40.7mW | 233.6mW |

SOURCE DRIVER HAVING AN OUTPUT BUFFER CIRCUIT WITH SLEW RATE COMPENSATION AND DISPLAY DEVICE THEREOF

CROSS-REFERENCE TO RELATED APPLICATION

This U.S. non-provisional application claims priority under 35 USC § 119 to Korean Patent Application No. 10-2020-0128520, filed on Oct. 6, 2020, in the Korean Intellectual Property Office (KIPO), the disclosure of which is incorporated by reference herein in its entirety.

BACKGROUND

Some example embodiments relate generally to semiconductor integrated circuits, and more particularly to an output buffer circuit and/or a source driver of a display device including the out buffer circuit.

Power consumption of a display device is increasing as a resolution, a size and/or an operation speed of the display device increases. Recently a frame rate of 120 Hz is applied to mobile devices such as smartphones, and power consumption of a display driver integrated circuit (DDI) is significantly increased. The DDI may be divided into an analog portion and a digital portion. The power consumption of the analog portion occupies about 66% of entire power consumption of the DDI, for example, in Wide Quad High Definition (WQHD) products. The power consumption of the analog portion may be divided into power consumption of a source driver and power consumption of the other components such as voltage regulators, charge pumps, Low Temperature Polysilicon (LTPS) drivers, etc. The source driver of the DDI include a huge number of source amplifiers or output buffers, for example, 2880 output buffers in case of the WQHD products, and the power consumption of the source driver occupies 46% of the power consumption of the analog portion.

SUMMARY

Some example embodiments may provide an output buffer circuit capable of reducing power consumption.

Alternatively or additionally, some example embodiments may provide a source driver of display device including the output buffer circuit capable of reducing power consumption.

According to some example embodiments, an output buffer circuit includes an operational amplifier configured to generate an amplifier output voltage signal based on an input voltage signal and on a compensation current, a slew rate compensating circuit configured to generate the compensation current to increase a slew rate of the amplifier output voltage signal based on a difference between the input voltage signal and a feedback voltage signal, an output path circuit connected between the operational amplifier and an output pad, the output path circuit configured to transfer the amplifier output voltage signal to generate a pad output voltage signal through the output pad, and a feedback path circuit, the feedback path circuit connected between the slew rate compensating circuit and a feedback input node that is on the output path circuit, the feedback path circuit configured to generate the feedback voltage signal.

According to some example embodiments, a source driver of a display device includes a plurality of output buffer circuits configured to drive source lines of a display panel, each of plurality of output buffer circuits configured to generate an amplifier output voltage signal based on an input voltage signal and on a compensation current, to generate a feedback voltage signal having a slew rate less than a slew rate of the amplifier output voltage signal, and to generate the compensation current to increase the slew rate of the amplifier output voltage signal, the increase based on a difference between the input voltage signal and the feedback voltage signal.

According to some example embodiments, a source driver of a display device includes a shift register configured to generate a plurality of latch clock signals based on a clock signal and on an input-output control signal, a data latch configured to store data in response to the plurality of latch clock signals and to output a plurality of digital input signals corresponding to the data in response to a load signal, a digital-to-analog converter configured to generate a plurality of input voltage signals corresponding to the plurality of digital inputs signals, the generating the plurality of input voltage signals using gray voltages, and a plurality of output buffer circuits configured to buffer the plurality of input voltage signals to drive source lines of a display panel. Each of the buffer circuits comprise an operational amplifier configured to generate an amplifier output voltage signal based on each of the input voltage signals and on a compensation current, a slew rate compensating circuit configured to generate the compensation current to increase a slew rate of the amplifier output voltage signal based on a difference between each of the input voltage signals and a feedback voltage signal, an output path circuit connected between the operational amplifier and an output pad, the output path circuit configured to transfer the amplifier output voltage signal to generate a pad output voltage signal through the output pad, and a feedback path circuit and connected between the slew rate compensating circuit and a feedback input node that is on the output path circuit, the feedback path circuit configured to generate the feedback voltage signal.

The output buffer circuit and the source driver of the display device according to some example embodiments may increase the supply time of the compensation current using the feedback voltage signal having the slew rate lower than the slew rate of the amplifier output voltage signal. Through the increase of the supply time of the compensation current, the power consumption may be reduced and/or the performance of the output buffer circuit and the source driver may be enhanced.

BRIEF DESCRIPTION OF THE DRAWINGS

Some example embodiments of the present disclosure will be more clearly understood from the following detailed description taken in conjunction with the accompanying drawings.

FIG. 20 is a diagram illustrating transition times and power consumption of the output buffer circuits of FIG. 18.

DETAILED DESCRIPTION OF SOME EXAMPLE EMBODIMENTS

Figure 1:
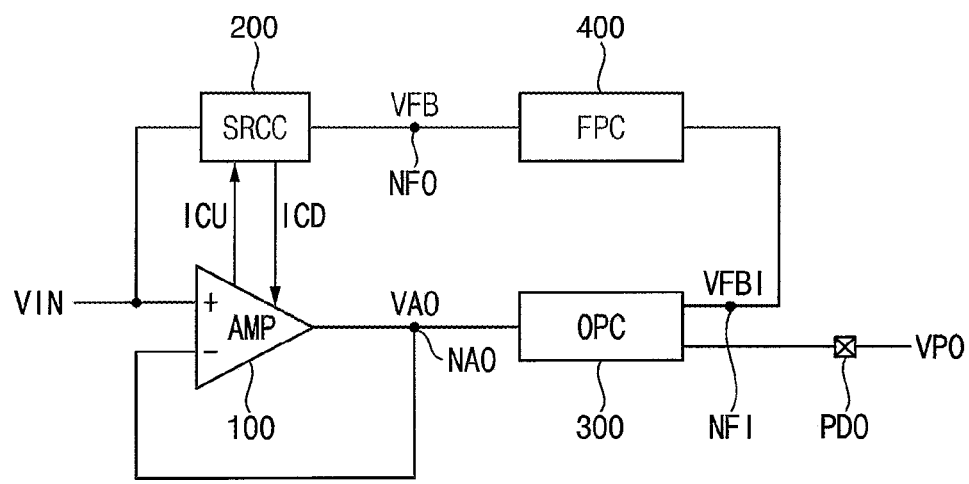
FIG. 1 is a block diagram illustrating an output buffer circuit according to some example embodiments.

Various non-limiting example embodiments will be described more fully hereinafter with reference to the accompanying drawings, in which some example embodiments are shown. In the drawings, like numerals refer to like elements throughout. The repeated descriptions may be omitted.

FIG. 1 is a block diagram illustrating an output buffer circuit according to some example embodiments.

Referring to FIG. 1, an output buffer circuit 10 includes an operational amplifier AMP 100, a slew rate compensating circuit SRCC 200, an output path circuit OPC 300, and a feedback path circuit FPC 400.

The operational amplifier 100 may generate an amplifier output voltage signal VAO based on an input voltage signal VIN and on a compensation current. The compensation current may include a pull-up compensation current ICU and a pull-down compensation current ICD. The operational amplifier 100 may receive the input voltage signal VIN through a positive terminal (+), receive the amplifier output voltage signal VAO through a negative terminal (−), and output the amplifier output voltage signal VAO through an output terminal, for example, through an amplifier output node NAO. Some example embodiments of the operational amplifier 100 will be described below with reference to FIGS. 4, 5 and 6.

The slew rate compensating circuit 200 may generate the compensation current ICU and ICD to increase a slew rate, e.g. a large or maximum rate of change of output voltage per time, of the amplifier output voltage signal VAO based on a difference between the input voltage signal VIN and a feedback voltage signal VFB. The compensation current ICU and ICD may include the pull-up compensation current ICU to increase the slew rate of a rising edge of the amplifier output voltage signal VAO, and/or may include the pull-down compensation current ICD to increase the slew rate of a falling edge of the amplifier output voltage signal VAO. Some example embodiments of the slew rate compensating circuit 200 will be described below with reference to FIGS. 7 and 8.

The output path circuit 300 may be connected between the operational amplifier 100 and the output pad PDO. The output path circuit 300 may transfer the amplifier output voltage signal VAO to generate a pad output voltage signal VPO through, e.g. on, the output pad PDO.

The feedback path circuit 400 may be connected between the slew rate compensating circuit 200 and a feedback input node NFI on the output path circuit 300. The feedback path circuit 400 may generate the feedback voltage signal VFB.

Some example embodiments of the output path circuit 300 and the feedback path circuit 400 will be described below with reference to FIGS. 10 through 14. As will be described, each of the output path circuit 300 and the feedback path circuit 400 may have a respective impedance, and the slew rate of a voltage signal may decrease while passing through at least at least a portion of the output path circuit 300 and the feedback path circuit 400. Here, "a slew rate of a voltage signal is decreased" may represent or correspond or indicate "a delay time of a voltage signal is increased" and/or "a transition time or a settling time of a voltage signal is increased".

Figure 2:
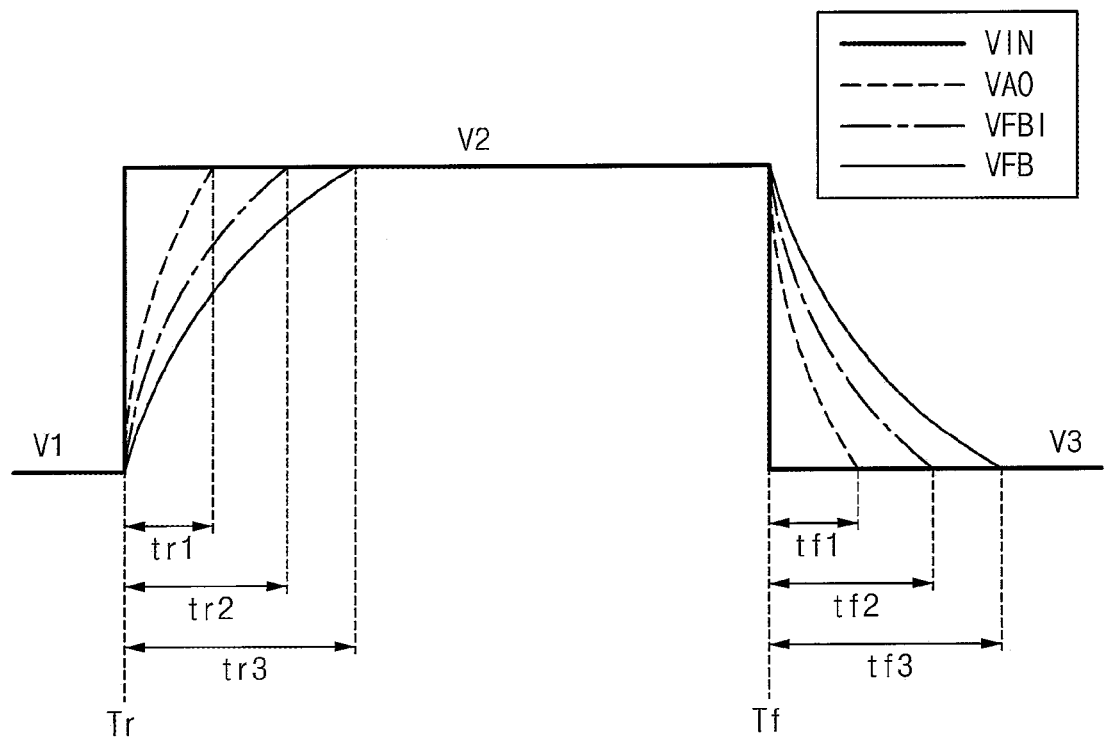
FIG. 2 is a waveform diagram illustrating voltage signals of an output buffer circuit according to some example embodiments.

FIG. 2 is a waveform diagram illustrating voltage signals of an output buffer circuit according to some example embodiments.

FIG. 2 illustrates waveforms of the amplifier output voltage signal VAO on the amplifier output node NAO, a voltage signal VFBI on the feedback input node NFI and the feedback voltage signal VFB on the feedback output node NFO. For example, FIG. 2 illustrates when the input voltage signal VIN transitions from a first voltage V1 to a second voltage V2 higher than the first voltage V1 at a first time point Tr and transitions from the second voltage V2 to a third voltage V3 lower than the second voltage V2 at a second time point Tf. For convenience of description and illustration, it is assumed that the input voltage signal VIN is an ideal square wave; however, example embodiments are not limited thereto.

Referring to FIGS. 1 and 2, a rising time tr2 of the voltage signal VFBI on the feedback input node NFI may increase to be longer than a rising time tr1 of the amplifier output voltage signal VAO, due to the impedance of the output path circuit 300, and a rising time tr3 of the feedback voltage signal VFB may increase to be longer than the rising time tr2 of the voltage signal VFBI on the feedback input node NFI due to the impedance of the feedback path circuit 400. For example, the slew rate (V2−V1)/tr2 of the rising edge of the voltage signal VFBI on the feedback input node NFI may decrease to be less than the slew rate (V2−V1)/tr1 of the rising edge of the amplifier output voltage signal VAO, and the slew rate (V2−V1)/tr3 of the rising edge of the feedback voltage signal VFB may decrease to be less than the slew rate (V2−V1)/tr2 of the rising edge of the voltage signal VFBI on the feedback input node NFI.

Alternatively or additionally, a failing time tr2 of the voltage signal VFBI on the feedback input node NFI may increase to be longer than a falling time tr1 of the amplifier output voltage signal VAO due to the impedance of the output path circuit 300, and a falling time tr3 of the feedback voltage signal VFB may increase to be longer than the falling time tr2 of the voltage signal VFBI on the feedback input node NFI due to the impedance of the feedback path circuit 400. For example, the slew rate (V2-V1)/tr2 of the falling edge of the voltage signal VFBI on the feedback input node NFI may decrease to be less than the slew rate (V2-V1)/tr1 of the falling edge of the amplifier output voltage signal VAO, and the slew rate (V2-V1)/tr3 of the falling edge of the feedback voltage signal VFB may decrease to be less than the slew rate (V2-V1)/tr2 of the falling edge of the voltage signal VFBI on the feedback input node NFI.

As such, the output buffer circuit 10 according to some example embodiments may increase the supply time of the compensation current ICU and ICD using the feedback voltage signal VFB having the slew rate lower than the slew rate of the amplifier output voltage signal VAO. Through the increase of the supply time of the compensation current ICU and ICD, the power consumption may be reduced, and/or the performance may be enhanced in devices and systems including the output buffer circuit 10.

Figure 3:
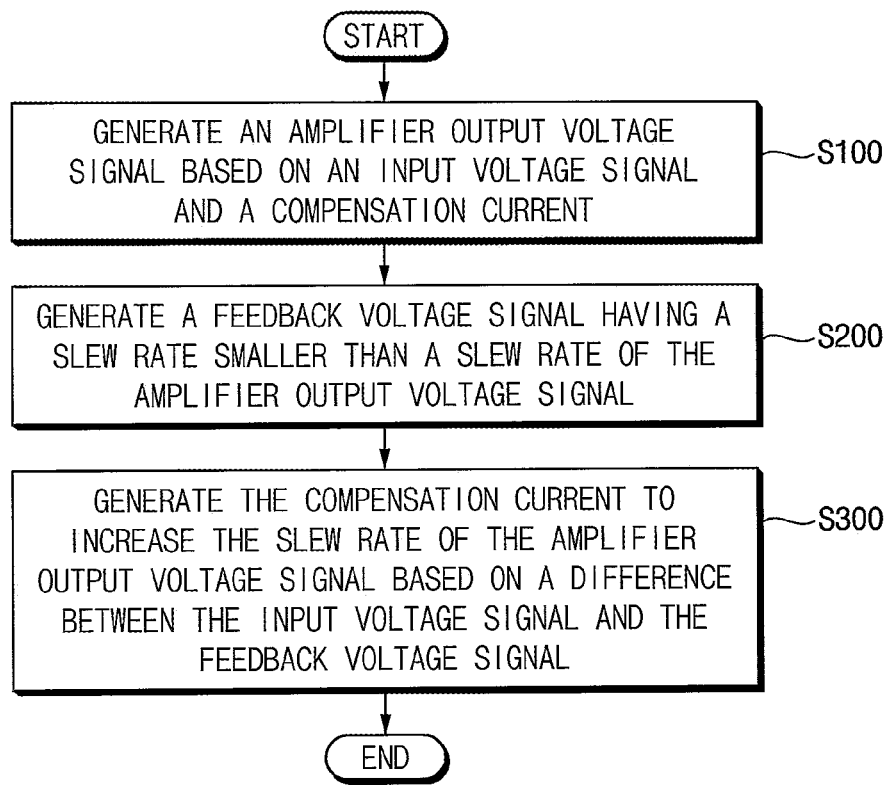
FIG. 3 is a flow chart illustrating a method of enhancing a slew rate of an output buffer circuit according to some example embodiments.

FIG. 3 is a flow chart illustrating a method of enhancing a slew rate of an output buffer circuit according to some example embodiments.

Referring to FIGS. 1 and 3, an amplifier output voltage signal VAO may be generated based on an input voltage signal VIN and on a compensation current ICU and ICD (S100), using an operational amplifier 100.

A feedback voltage signal VFB having a slew rate smaller or less than a slew rate of the amplifier output voltage signal may be generated (S200), using an output path circuit 300 and a feedback path circuit 400.

The compensation current ICU and ICD that increase the slew rate of the amplifier output voltage signal VAO may be generated based on a difference between the input voltage signal VIN and the feedback voltage signal VFB (S300), using a slew rate compensating circuit 200.

Hereinafter, some example embodiments of an operational amplifier 100 and a slew rate compensating circuit included in an output buffer circuit will be described with reference to FIGS. 4 through 8. According to some example embodiments, the supply time of the compensation current ICU and ICD may increase using the feedback voltage signal VFB having the slew rate less than the slew rate of the amplifier output voltage signal VAO. The configurations of the operational amplifier and the slew rate compensating circuit are not limited to those illustrated in FIGS. 4 through 8, and the configurations of the operational amplifier and the slew rate compensating circuit may be implemented variously.

Figure 4:
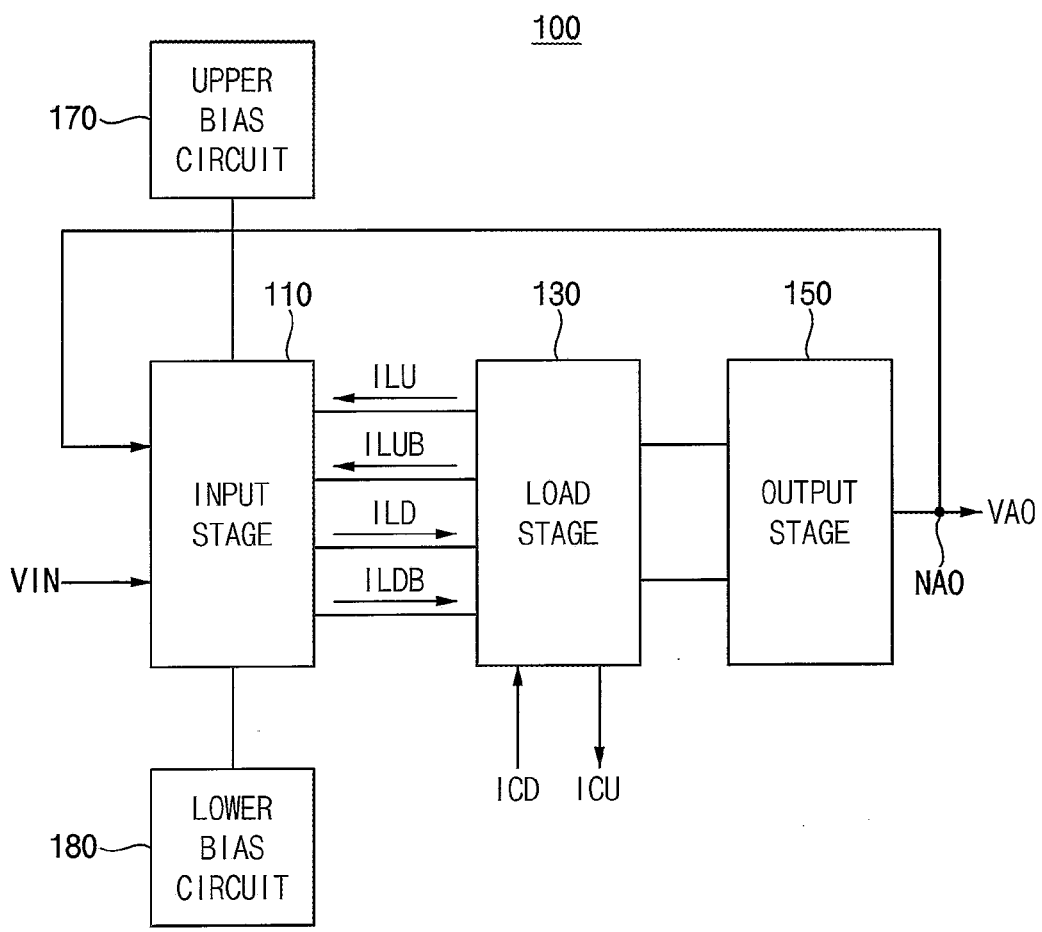
FIG. 4 is a block diagram illustrating some example embodiments of an operational amplifier included in the output buffer circuit of FIG. 1.

FIG. 4 is a block diagram illustrating some example embodiments of an operational amplifier included in the output buffer circuit of FIG. 1.

Referring to FIG. 4, an operational amplifier 100 may include an input stage 110, a load stage 130, an output stage 150, an upper bias circuit 170, and a lower bias circuit 180. In some example embodiments, the operational amplifier 100 shown in FIG. 4 may have a rail-to-rail structure that includes double input stages.

The operational amplifier 100 amplifies an input voltage signal VIN to generate an amplifier output voltage signal VAO. The slew rate compensating circuit 200 in FIG. 1 generates a compensation current based on a voltage difference between the input voltage signal VIN and the amplifier output voltage signal VAO, provides the compensation current to the load stage 130 of the operational amplifier 100, and reduces a transition time of the amplifier output voltage signal VAO, for example, by increasing a slew rate of the amplifier output voltage signal VAO.

The input stage 110 receives the input voltage signal VIN and the amplifier output voltage signal VAO, and determines a voltage difference between the input voltage signal VIN and the amplifier output voltage signal VAO. The load stage 130 performs a slew rate compensating operation using a pull-up compensation current ICU and a pull-down compensation current ICD, generates load currents ILU, ILUB, ILD, and ILDB corresponding to the voltage difference between the input voltage signal VIN and the amplifier output voltage signal VAO, and provides the load currents ILU, ILUB, ILD, and ILDB to the input stage 110. The upper bias circuit 170 and the lower bias circuit 180 provide bias currents to the input stage 110. The output stage 150 generates the amplifier output voltage signal VAO through the amplifier output node NAO, based on signals provided from the load stage 130.

Figure 5:
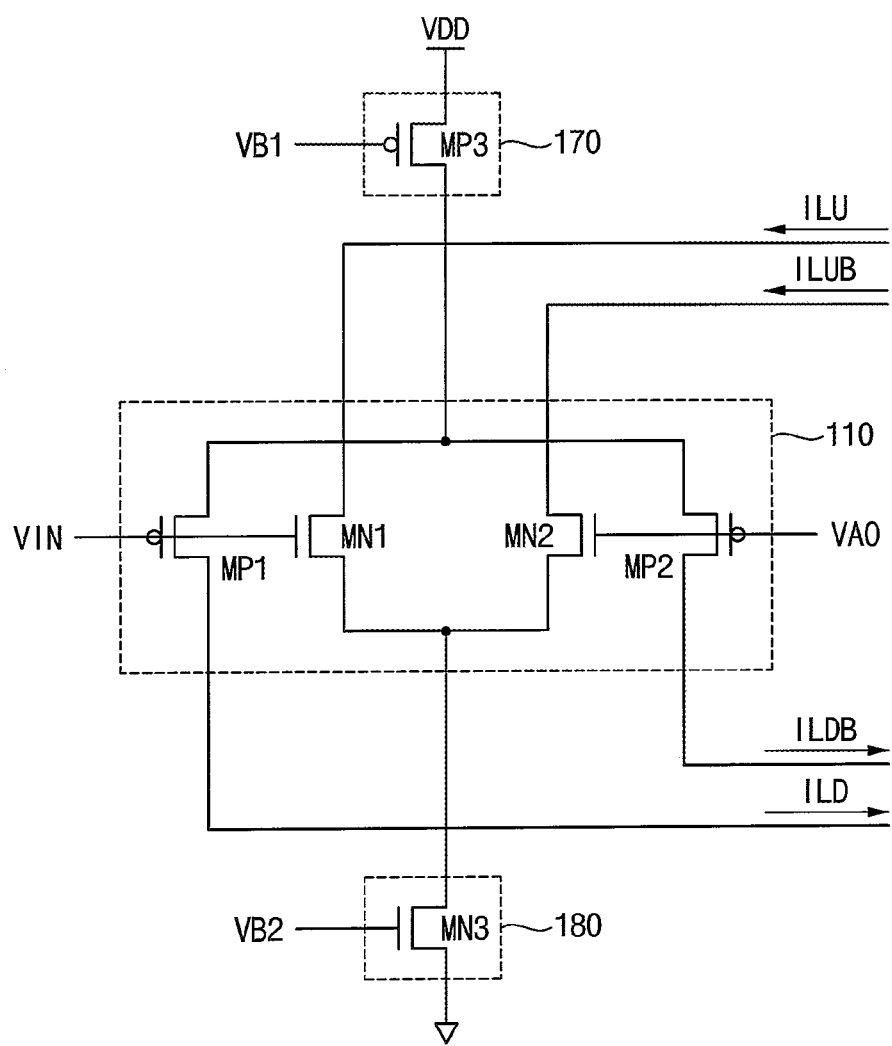
FIG. 5 is a circuit diagram illustrating some example embodiments of an input stage and bias circuits included in the operational amplifier of FIG. 4.

FIG. 5 is a circuit diagram illustrating some example embodiments of an input stage and bias circuits included in the operational amplifier of FIG. 4.

Referring to FIGS. 4 and 5, the input stage 110 may include a first input stage and a second input stage. The first input stage may include P channel metal-oxide-semiconductor (hereinafter, referred to as "PMOS") transistors MP1 and MP2, and may receive a pull-down load current ILD and ILDB from the load stage 130. The second input stage may include N channel metal-oxide-semiconductor (hereinafter, referred to as "NMOS") transistors MN1 and MN2, and may receive a pull-up load current ILU and ILUB from the load stage 130. The input voltage signal VIN is applied to the gates of the transistors MP1 and MN1 and the amplifier output voltage signal VAO is applied to the gates of the transistors MP2 and MN2.

The upper bias circuit 170 may generate a first bias current based on a first bias voltage VB1, and may provide the first bias current to the first input stage. The lower bias circuit 180 may generate a second bias current based on a second bias voltage VB2, and may provide the second bias current to the second input stage. The upper bias circuit 170 may be implemented with a PMOS transistor MP3, and the lower bias circuit 180 may be implanted with an NMOS transistor MN3.

Figure 6:
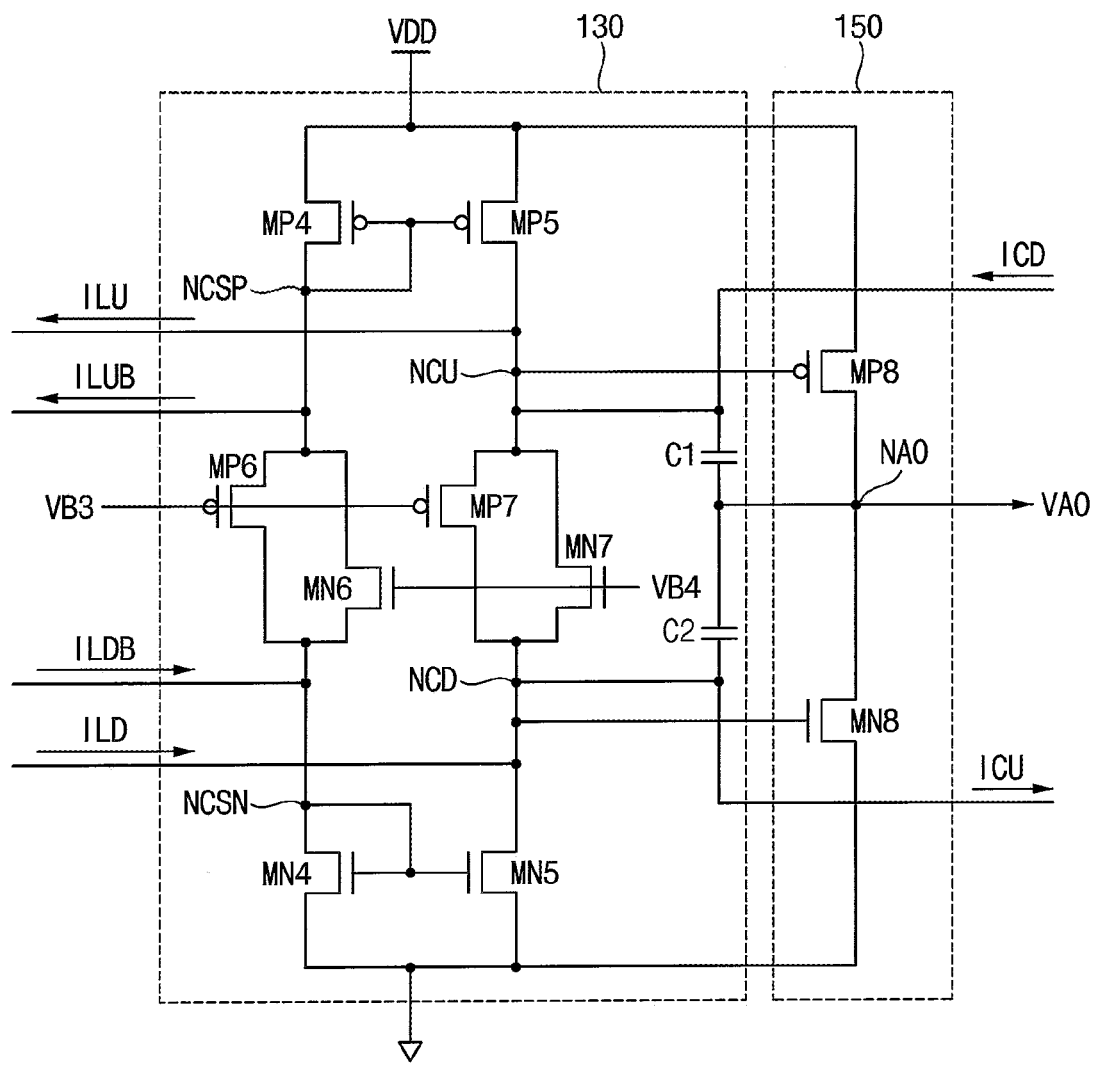
FIG. 6 is a circuit diagram illustrating some example embodiments of a load stage and an output stage included in the operational amplifier of FIG. 4.

FIG. 6 is a circuit diagram illustrating some example embodiments of a load stage and an output stage included in the operational amplifier of FIG. 4.

Referring to FIG. 6, the load stage 130 may include an upper current mirror circuit, a lower current mirror circuit, a first connecting circuit, a second connecting circuit, a first capacitor C1, and a second capacitor C2.

The upper current mirror circuit may include PMOS transistors MP4 and MP5 that are connected in a current-mirror form to each other and to a power supply such as to VDD, and similarly the lower current mirror circuit may include NMOS transistors MN4 and MN5 that are connected in a current-mirror form to each other and to a power supply such as to ground. The first connecting circuit may include a PMOS transistor MP7 and an NMOS transistor MN7. The PMOS transistor MP7 and the NMOS transistor MN7 operate in response to a third bias voltage VB3 and a fourth bias voltage VB4, respectively. The second connecting circuit may include a PMOS transistor MP6 and an NMOS transistor MN6. The PMOS transistor MP6 and the NMOS transistor MN6 operate in response to the third bias voltage VB3 and the fourth bias voltage VB4, respectively.

The upper current mirror circuit is electrically connected to the second input stage and provides a current to the load stage 130. The lower current mirror circuit electrically is connected to the first input stage and provides a current to the load stage 130. The first connecting circuit electrically connects a first output terminal NCU of the upper current mirror circuit and a first output terminal NCD of the lower current mirror circuit. The second connecting circuit electrically connects a second output terminal NCSP of the upper current mirror circuit and a second output terminal NCSN of the lower current mirror circuit. The first capacitor C1 is connected between the first output NCU terminal of the upper current mirror circuit and an amplifier output node NAO of the output stage 150. The second capacitor C2 is connected between the first output terminal NCD of the lower current mirror circuit and the amplifier output node NAO of the output stage 150.

The output stage 150 may include a PMOS transistor MP8. A gate of the PMOS transistor MP8 is connected to the first output NCU terminal of the upper current mirror circuit, and the PMOS transistor MP8 is connected between the supply voltage VDD and the amplifier output node NAO. The output stage may further include an NMOS transistor MN8. A gate of the NMOS transistor MN8 is connected to the first output terminal NCD of the lower current mirror circuit, and the NMOS transistor MN8 is connected between the amplifier output node NAO and the ground.

The pull-down compensation current ICD may be provided to the first output terminal NCU of the upper current mirror circuit, and the pull-up compensation current ICU may be provided to the first output terminal NCD of the lower current mirror circuit.

The pull-up load current ILU may flow from the first output terminal NCU of the upper current mirror circuit to the second input stage, including the NMOS transistors MN1 and MN2 of the input stage 110. The pull-up load current ILUB may flow from the second output terminal NCSP of the upper current minor circuit to the second input stage included in the input stage 110.

The pull-down load current ILD may flow from the first input stage including the PMOS transistors MP1 and MP2 of the input stage 110 to the first output terminal NCD of the lower current minor circuit. The pull-down load current ILDB may flow from the first input stage included in the input stage 110 to the second output terminal NCSN of the lower current mirror circuit.

Figure 7:
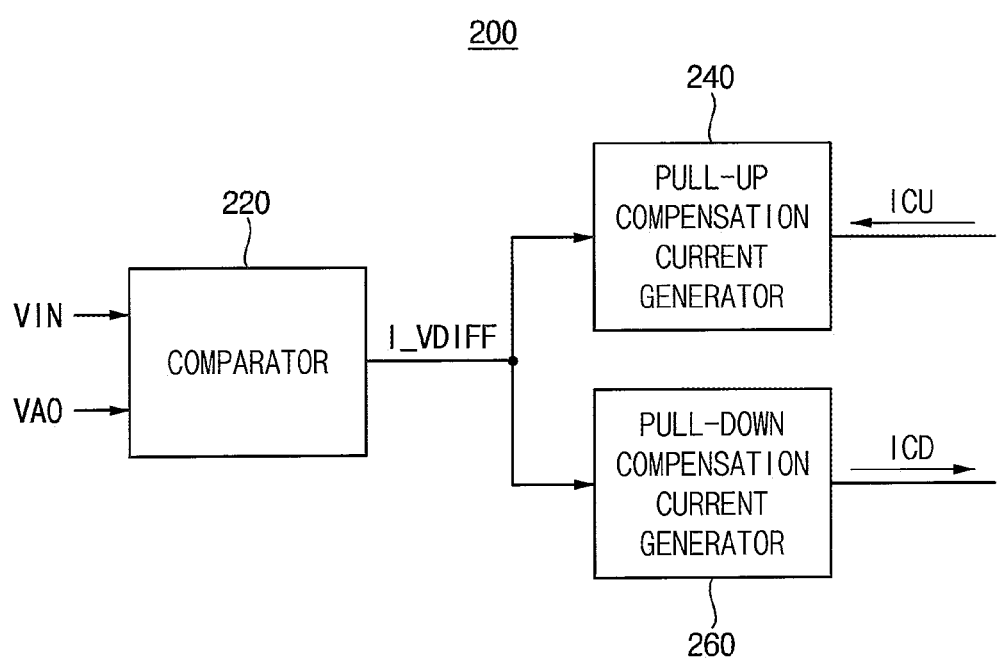
FIG. 7 is a block diagram illustrating some example embodiments of a slew rate compensating circuit included in the output buffer circuit of FIG. 1.

FIG. 7 is a block diagram illustrating some example embodiments of a slew rate compensating circuit included in the output buffer circuit of FIG. 1.

Referring to FIG. 7, the slew rate compensating circuit 200 may include a comparator 220, a pull-up compensation current generator 240, and a pull-down compensation current generator 260.

The comparator 220 may compare the input voltage signal VIN with the amplifier output voltage signal VAO to generate a first current I_VDIFF corresponding to a difference between the input voltage signal VIN and the amplifier output voltage signal VAO. The pull-up compensation current generator 240 may perform a current-minor operation on the first current I_VDIFF to generate the pull-up compensation current ICU. The pull-down compensation current generator 260 performs the current-minor operation on the first current I_VDIFF to generate the pull-down compensation current ICD.

Figure 8:
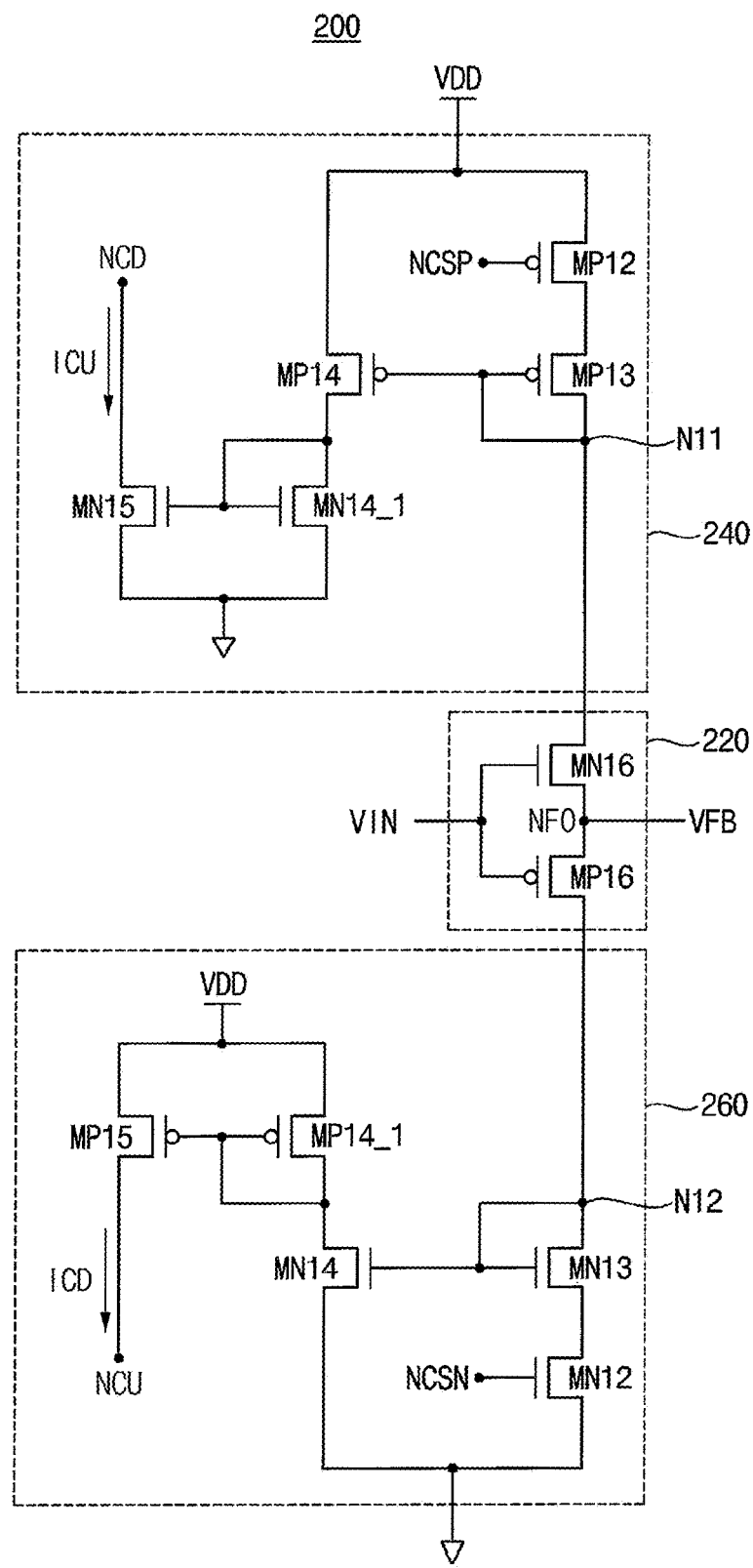
FIG. 8 is a circuit diagram illustrating some example embodiments of the slew rate compensating circuit of FIG. 7.

FIG. 8 is a circuit diagram illustrating some example embodiments of the slew rate compensating circuit of FIG. 7.

Referring to FIG. 8, the slew rate compensating circuit 200 includes the comparator 220, the pull-up compensation current generator 240 and the pull-down compensation current generator 260.

The comparator 200 may include an NMOS transistor MN16 and a PMOS transistor MP16. The NMOS transistor MN16 has a gate to which the input voltage signal VIN is applied, a source to which the feedback voltage signal VFB is applied, and a drain connected to a first node N11. The PMOS transistor MP16 has a gate to which the input voltage signal VIN is applied, a source to which the feedback voltage signal VFB is applied, and a drain connected to a second node N12.

The pull-up compensation current generator 240 may include PMOS transistors MP12, MP13, MP14, and NMOS transistors MN14_1 and MN15.

The PMOS transistor MP12 has a source connected to a supply voltage VDD, and a gate connected to an output terminal NCSP of the upper current minor circuit included in the load stage 130 of the operational amplifier 100. The PMOS transistor MP13 has a source connected to a drain of the PMOS transistor MP12, a gate and a drain that are commonly connected to the first node N11. The PMOS transistor MP14 has a source connected to the supply voltage VDD, and a gate connected to the gate of the PMOS transistor MP13. The NMOS transistor MN14_1 has a drain and a gate, with the gate and drain commonly connected to a drain of the PMOS transistor MP14, and a source connected to the ground. The NMOS transistor MN15 has a gate connected to the gate of the NMOS transistor MN14_1, a source connected to the ground, and a drain from which the pull-up compensation current ICU is output.

The pull-down compensation current generator 260 may include NMOS transistors MN12, MN13, MN14, and PMOS transistors MP14_1 and MP15.

The NMOS transistor MN12 has a source connected to the ground and a gate connected to an output terminal NCSN of the lower current mirror circuit included in the load stage 130 of the operational amplifier 100. The NMOS transistor MN13 has a source connected to a drain of the first NMOS transistor MN12 and a drain and a gate that are commonly connected to the second node N12. The NMOS transistor MN14 has a source connected to the ground, and a gate connected to the gate of the NMOS transistor MN13. The PMOS transistor MP14_1 has a drain and a gate that are commonly connected to a drain of the NMOS transistor MN14, and a source connected to the supply voltage VDD. The PMOS transistor MP15 has a gate connected to the gate of the PMOS transistor MP14_1, a source connected to the supply voltage VDD, and a drain from which the pull-down compensation current ICD is output.

The NMOS transistor MN16 and the PMOS transistor MP16 included in the comparator 220 may have respective threshold voltages. In some example embodiments, a body of the NMOS transistor MN16 may be electrically connected to the source of the NMOS transistor MN16, and a body of the PMOS transistor MP16 may be electrically connected to the source of the PMOS transistor MP16. Further, the body of the NMOS transistor MN16 may be electrically connected to the body of the PMOS transistor MP16. When a body (e.g., a bulk) of an NMOS transistor and/or a body (e.g. a bulk) of a PMOS transistor is electrically connected to a source of the NMOS transistor or the PMOS transistor, a threshold voltage of the NMOS transistor and/or the PMOS transistor may have a constant value even when a back-bias voltage of the NMOS transistor and/or the PMOS transistor varies.

Hereinafter, operations of the operational amplifier 100 and the slew rate compensating circuit included in the output buffer circuit according to some example embodiments are described with reference to the example configurations of FIGS. 4 through 8.

The input voltage signal VIN is applied to the NMOS transistors MN16 and the PMOS transistors MP16 of the comparator 220, and the feedback voltage signal VFB is applied to the feedback output node NFO corresponding to the sources of the NMOS transistor MN16 and the PMOS transistor MP16.

When the input voltage signal VIN transitions from a lower voltage level to a higher voltage level, the NMOS transistor MN16 is turned on, the NMOS transistor MN15 is turned on, and the voltage of the second capacitor C2 is pulled down by the pull-up compensation current ICU. Here, the gate voltage of the PMOS transistor MP8 is decreased rapidly to cause an instantaneous current in the output buffer circuit, and thus the amplifier output voltage signal VAO may be settled rapidly. Such operation continues until the gate-source voltage VIN-VFB of the NMOS transistor MN16 becomes equal to a threshold voltage VTHN of the NMOS transistor MN16. At a time point when the gate-source voltage VIN-VFB is equal to the threshold voltage VTHN, the NMOS transistor MN16 is turned off and the pull-up compensating operation, for example, the generation of the pull-up compensation current ICU is finished.

In contrast, when the input voltage signal VIN transitions from a higher voltage level to a lower voltage level, the PMOS transistor MP16 is turned on, the PMOS transistor MP15 is turned on, and the voltage of the first capacitor C1 is pulled up by the pull-down compensation current ICD. Here, the gate voltage of the NMOS transistor MN8 is increased rapidly to cause an instantaneous current in the output buffer circuit, and thus the amplifier output voltage signal VAO may be settled rapidly. Such operation continues until the gate-source voltage VFB-VIN of the PMOS transistor MP16 becomes equal to a threshold voltage VTHP of the PMOS transistor MP16. At a time point when the gate-source voltage VFB-VIN is equal to the threshold voltage VTHP, the PMOS transistor MP16 is turned off and the pull-down compensating operation, for example, the generation of the pull-down compensation current ICD is finished.

A factor, e.g. a major factor affecting performance of the slew rate compensating circuit 200 is the supply time of the compensation current ICU and ICD. The supply time is determined by the time point when the gate-source voltages VIN-VFB or VFB-VIN become equal to the threshold voltages VTHN and VTHP, respectively. The voltage level of the input voltage signal VIN and the threshold voltages VTHN and VTHP are not factors that may be adjusted. In contrast, the supply time of the compensation current may be adjusted as will be described below with reference to FIG. 9.

Figure 9:
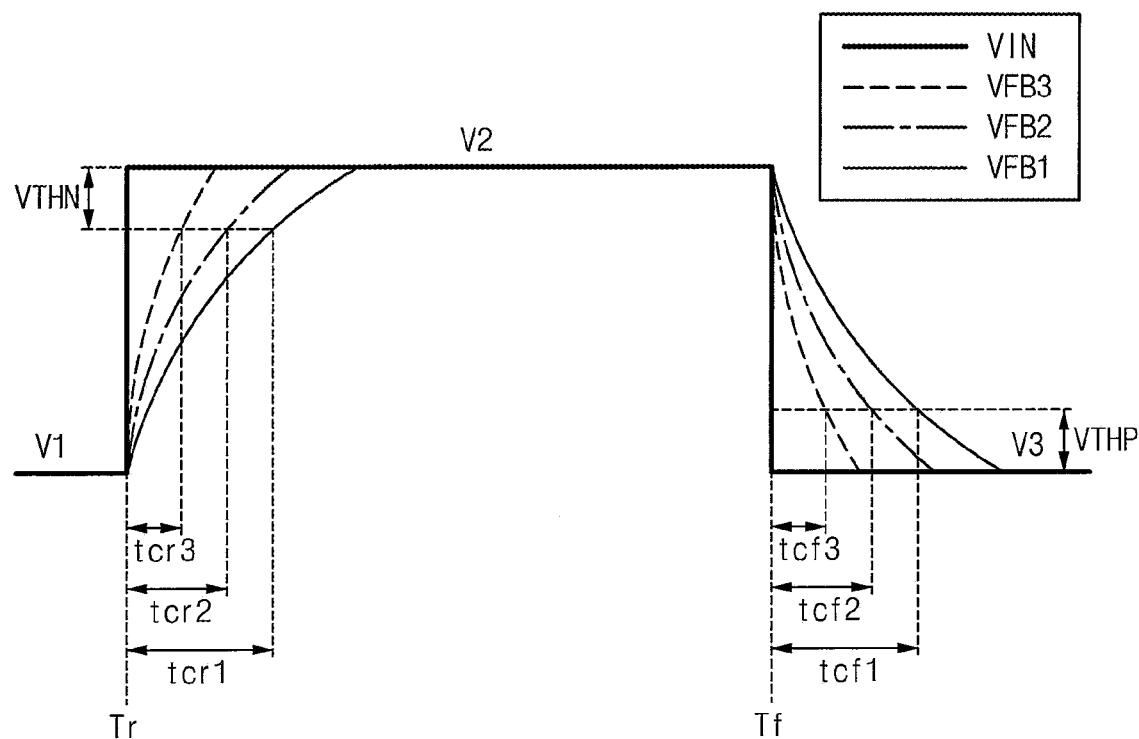
FIG. 9 is a waveform diagram for describing a compensation time of an output buffer circuit according to some example embodiments.

FIG. 9 is a waveform diagram for describing a compensation time of an output buffer circuit according to some example embodiments.

FIG. 9 illustrates waveforms of feedback voltage signals on the feedback output node NFO, when the input voltage signal VIN transitions from a first voltage V1 to a second voltage V2 greater than the first voltage V1 at a first time point Tr and transitions from the second voltage V2 to a third voltage V3 less than the second voltage V2 that may be the same as or different from the first voltage V1 at a second time point Tf. For convenience of description and illustration, it is assumed that the input voltage signal VIN is an ideal square wave. A first feedback voltage signal VFB1, a second feedback voltage signal VFB2 and a third feedback voltage signal VFB3 shown in FIG. 1 have different slew rates. The slew rate of the second feedback voltage signal VFB2 may be less than the slew rate of the first feedback voltage signal VFB1, and the slew rate of the third feedback voltage signal VFB3 may be less than the second feedback voltage signal VFB2.

As described with reference to FIGS. 4 through 8, the pull-up compensation time (and/or the supply time) corresponds to a time interval from the first time point Tr to the time point when the gate-source voltage VIN-VFB=V2-VFB of the NMOS transistor MN16 becomes equal to the threshold voltage VTHN of the NMOS transistor MN16, and the pull-down compensation time corresponds to a time interval from the second time point Tf to the time point when the gate-source voltage VFB-VIN=VFB-V3 of the PMOS transistor MP16 becomes equal to the threshold voltage VTHP of the PMOS transistor MP16.

As illustrated in FIG. 9, the pull-up compensation time tcr2 corresponding to the second feedback voltage signal VFB2 is longer than the pull-up compensation time tcr3 corresponding to the third feedback voltage signal VFB3, and the pull-up compensation time tcr1 corresponding to the first feedback voltage signal VFB1 is longer than the pull-up compensation time tcr2 corresponding to the second feedback voltage signal VFB2. Furthermore, the pull-down compensation time tcf2 corresponding to the second feedback voltage signal VFB2 is longer than the pull-down compensation time tcf3 corresponding to the third feedback voltage signal VFB3, and the pull-down compensation time tcf1 corresponding to the first feedback voltage signal VFB1 is longer than the pull-down compensation time tcf2 corresponding to the second feedback voltage signal VFB2. As a result, the pull-up compensation time and/or the pull-down compensation time may be increased as the slew rate of the feedback voltage signal applied to the comparator 220 is decreased.

In conventional schemes, the slew rate compensating operation is performed based on the amplifier output voltage signal VAO. In contrast, according to some example embodiments, the slew rate compensating operation is performed based on the feedback voltage signal VFB having the slew rate less than the slew rate of the amplifier output voltage signal VAO, so as to increase the compensation time. Through the increase of the compensation time or the supply time of the compensation current, the slew rate of the output voltage signal may be further increased, and the performance of the devices and systems including the output buffer circuit may be enhanced and/or the power consumption may be reduced.

Figure 10:
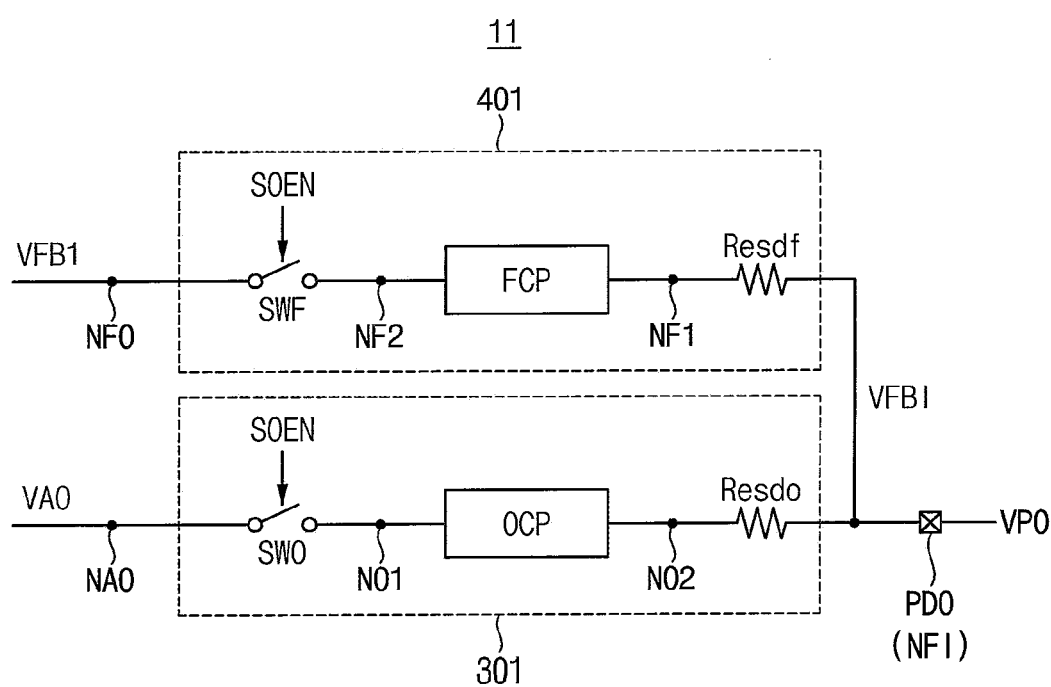
FIGS. 10, 11 and 12 are diagrams illustrating an output buffer circuit according to some example embodiments.
Figure 11:
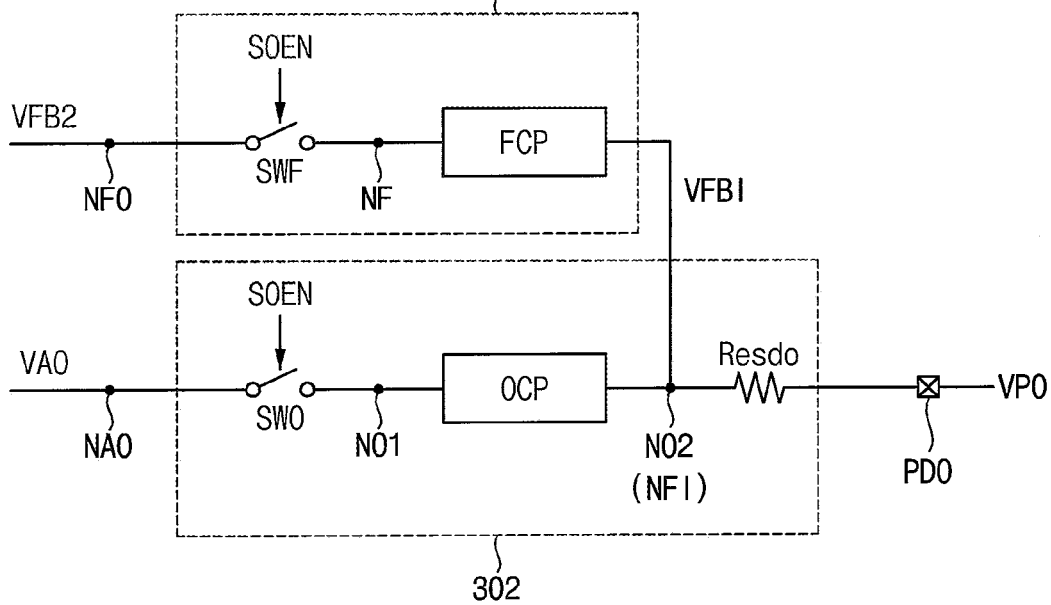
Figure 12:
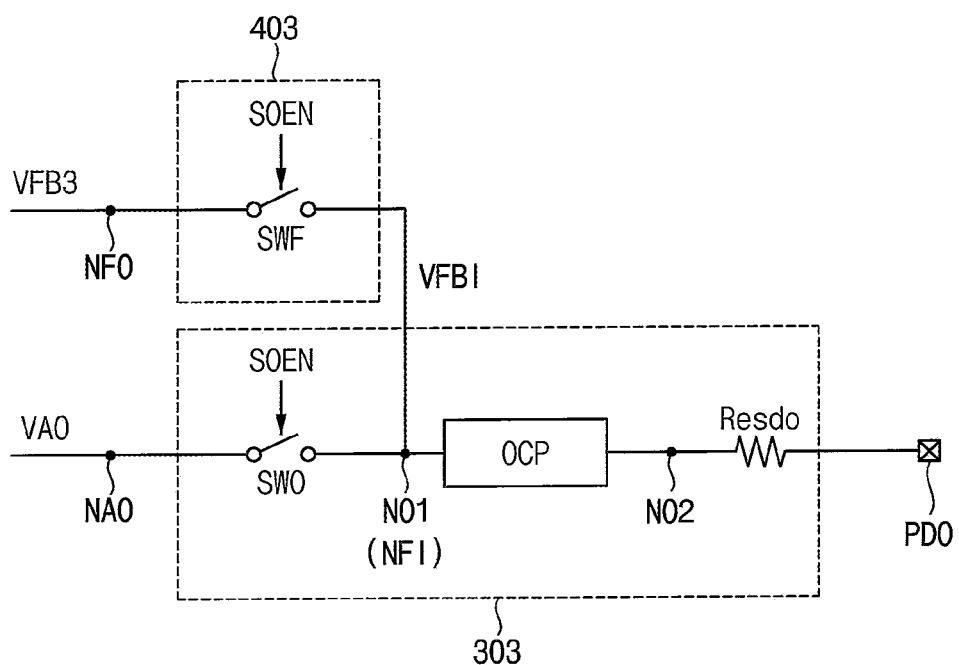

FIGS. 10, 11 and 12 are diagrams illustrating an output buffer circuit according to some example embodiments.

FIG. 10 illustrates some example embodiments that the feedback input node NFI corresponds to the output pad PDO, and the feedback path circuit generates the feedback voltage signal VFB1 based on the pad output voltage signal VPO on the output pad PDO. FIGS. 11 and 12 illustrate some example embodiments where the feedback input node NFI corresponds to an output intermediate node inside the output path circuit, and the feedback path circuit generates the feedback voltage signal VFB based on a voltage signal on the output intermediate node.

Referring to FIG. 10, an output buffer circuit 11 may include an output path circuit 301 and a feedback path circuit 401. The operational amplifier 100 and the slew rate compensating circuit 200 as described above are omitted in FIG. 10. The output buffer circuit 11 may or may not include an operational amplifier 100 and/or a slew rate compensating circuit 200.

The output path circuit 301 may include an output switch SWO, an output conduction path OCP, and an output electrostatic discharge (ESD) resistor Resdo.

The output switch SWO is connected between an amplifier output node NAO generating the amplifier output voltage signal VAO and a first output intermediate node N01, and the output switch SWO is turned on in response to an output enable signal SOEN. The electrical connection between the amplifier output node NAO and the output pad PDO may be controlled using the output switch SWO and the output enable signal SOEN.

The output conduction path OCP is connected between the first output intermediate node NO1 and a second output intermediate node NO2. The output conduction path OCP may include conduction patterns formed in conduction layers above a semiconductor substrate and vertical contacts connecting the conduction patterns, etc. The output conduction path OCP may have impedance caused by parasitic resistance and parasitic capacitance of the output conduction path OCP.

The output ESD resistor Resdo is connected between the second output intermediate node NO1 and the output pad PDO. The output ESD resistor Resdo may protect the inner circuits from electrostatic discharge (ESD) such as from triboelectric discharge, through the output pad PDO.

The output switch SWO, the output conduction path OCP and the output EDS resistor Redso may have respective resistance. For example, the output switch may have a turn-on resistance value, the output conduction path OCP may have a parasitic resistance value and the output ESD resistor Resdo may have a specific (or, alternatively, predetermined) resistance value.

The feedback path circuit 401 may include a feedback ESD resistor Resdf, a feedback conduction path FCP and a feedback switch SWF.

The feedback ESD resistor Resdf is connected between the output pad PDO and a first feedback intermediate node NF1. The feedback ESD resistor Resdf may protect the inner circuits from electrostatic discharge through the output pad PDO.

The feedback conduction path FCP is connected between the first feedback intermediate node NF1 and a second feedback intermediate node NF2. The feedback conduction path FCP may include conduction patterns formed in conduction layers above a semiconductor substrate and vertical contacts connecting the conduction patterns, etc. The feedback conduction path FCP may have impedance caused by parasitic resistance and/or parasitic capacitance of the feedback conduction path FCP.

The feedback switch SWF is connected between the second feedback intermediate node NF2 and a feedback output node NFO generating the feedback voltage signal VFB1. The feedback switch SWF is turned on in response to the output enable signal SOEN. The electrical connection between the feedback output node NFO and the output pad PDO may be controlled using the feedback switch SWF and the output enable signal SOEN.

In some example embodiments e.g. as illustrated in FIG. 10, the output pad PDO corresponds to a feedback point, for example, to the feedback input node NFI. As such, the feedback path circuit 401 may generate the feedback voltage signal VFB based on the voltage signal VFBI, for example, the pad output voltage signal VPO on the output pad PDO, such that the slew rate of the feedback voltage signal VFB1 is smaller than the slew rate of the amplifier output voltage signal VAO.

Referring to FIG. 11, an output buffer circuit 12 may include an output path circuit 302 and a feedback path circuit 402. The operational amplifier 100 and the slew rate compensating circuit 200 as described above are omitted in FIG. 11. The output buffer circuit 12 may or may not include the operational amplifier 100 and/or the slew rate compensating circuit 200.

The output path circuit 302 may include an output switch SWO, an output conduction path OCP and an output electrostatic discharge (ESD) resistor Resdo. The output path circuit 302 in FIG. 11 is the same as the output path circuit 301 in FIG. 10, and the repeated descriptions are omitted.

The feedback path circuit 402 may include a feedback conduction path FCP and a feedback switch SWF.

The feedback ESD resistor Resdf is connected between the second output intermediate node NO2 and a feedback intermediate node NF. The feedback conduction path FCP may include conduction patterns formed in conduction layers above a semiconductor substrate and/or vertical contacts and/or vias connecting the conduction patterns, etc. The feedback conduction path FCP may have impedance caused by parasitic resistance and/or parasitic capacitance of the feedback conduction path FCP.

The feedback switch SWF is connected between the feedback intermediate node NF and a feedback output node NFO generating the feedback voltage signal VFB2, The feedback switch SWF is turned on in response to the output enable signal SOEN.

The feedback switch SWF is connected between the second feedback intermediate node NF2 and a feedback output node NFO generating the feedback voltage signal VFB1. The feedback switch is turned on in response to the output enable signal SOEN. The electrical connection between the feedback output node NFO and the output pad PDO may be controlled using the feedback switch SWF and the output enable signal SOEN.

In some example embodiments, for example as illustrated in FIG. 11, the second output intermediate node NO2 corresponds to a feedback point, for example, the feedback input node NFI. As such, the feedback path circuit 402 may generate the feedback voltage signal VFB2 based on the voltage signal VFBI on the second output intermediate node NO2 such that the slew rate of the feedback voltage signal VFB2 is smaller than the slew rate of the amplifier output voltage signal VAO.

Referring to FIG. 12, an output buffer circuit 13 may include an output path circuit 303 and a feedback path circuit 403. The operational amplifier 100 and the slew rate compensating circuit 200 as described above are omitted in FIG. 12. The output buffer 13 may or may not include the operational amplifier 100 and/or the slew rate compensating circuit 200

The output path circuit 302 may include an output switch SWO, an output conduction path OCP and an output electrostatic discharge (ESD) resistor Resdo. The output path circuit 303 in FIG. 12 is the same as the output path circuit 301 in FIG. 10, and the repeated descriptions are omitted.

The feedback path circuit 402 may include a feedback switch SWF.

The feedback switch SWF is connected between the first output intermediate node NO1 and a feedback output node NFO generating the feedback voltage signal VFB3, The feedback switch SWF is turned on in response to the output enable signal SOEN. The electrical connection between the feedback output node NFO and the output pad PDO may be controlled using the feedback switch SWF and the output enable signal SOEN.

In some example embodiments, for example as illustrated in FIG. 12, the first output intermediate node NO1 corresponds to a feedback point, for example, the feedback input node NFI. As such, the feedback path circuit 403 may generate the feedback voltage signal VFB3 based on the voltage signal VFBI on the first output intermediate node NO1 such that the slew rate of the feedback voltage signal VFB3 is smaller than the slew rate of the amplifier output voltage signal VAO.

As described with reference to FIGS. 10, 11 and 12, one of the feedback signals VFB1, VFB2 and VFB3 as illustrated in FIG. 9 may be generated depending on the selection of the feedback point, for example, the feedback input node NFI. As described above, the compensation time may be increased, the slew rate of the output signals VAO and VPO may be increased and the power consumption may be reduced, as the slew rate of the feedback voltage signal VFB is decreased. In contrast, the size of the feedback path circuit may be increased as the slew rate of the feedback voltage signal VFB is decreased. The appropriate configuration of the feedback path circuit to generate the feedback voltage signal VFB having the proper slew rate may be selected considering required or intended performance and/or design margin, etc.

Figure 13:
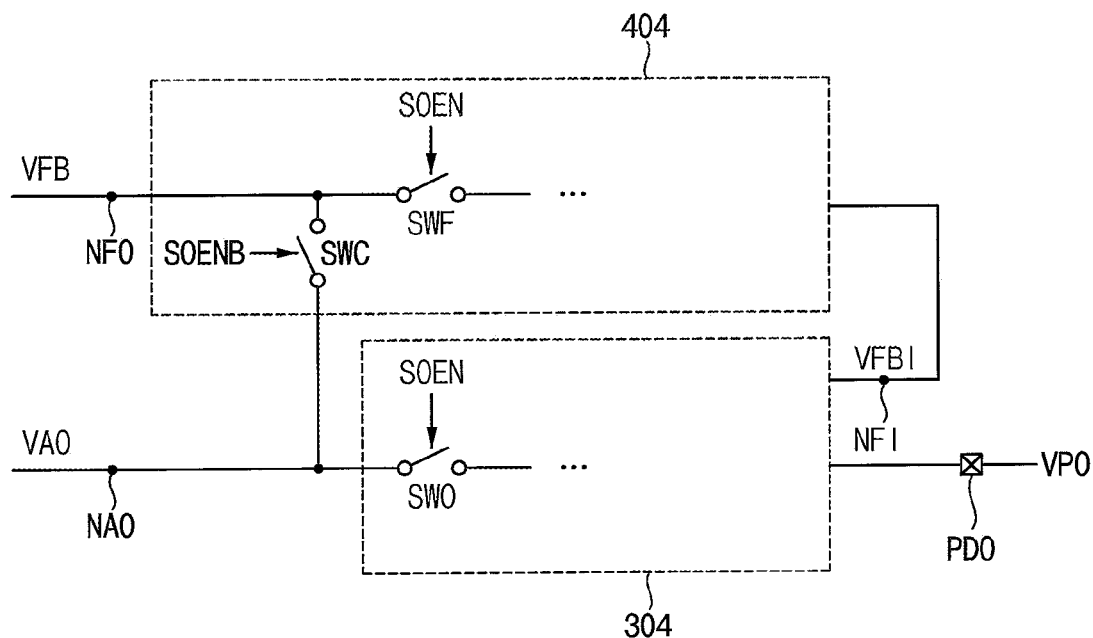
FIG. 13 is a diagram illustrating an output buffer circuit according to some example embodiments.
Figure 14:
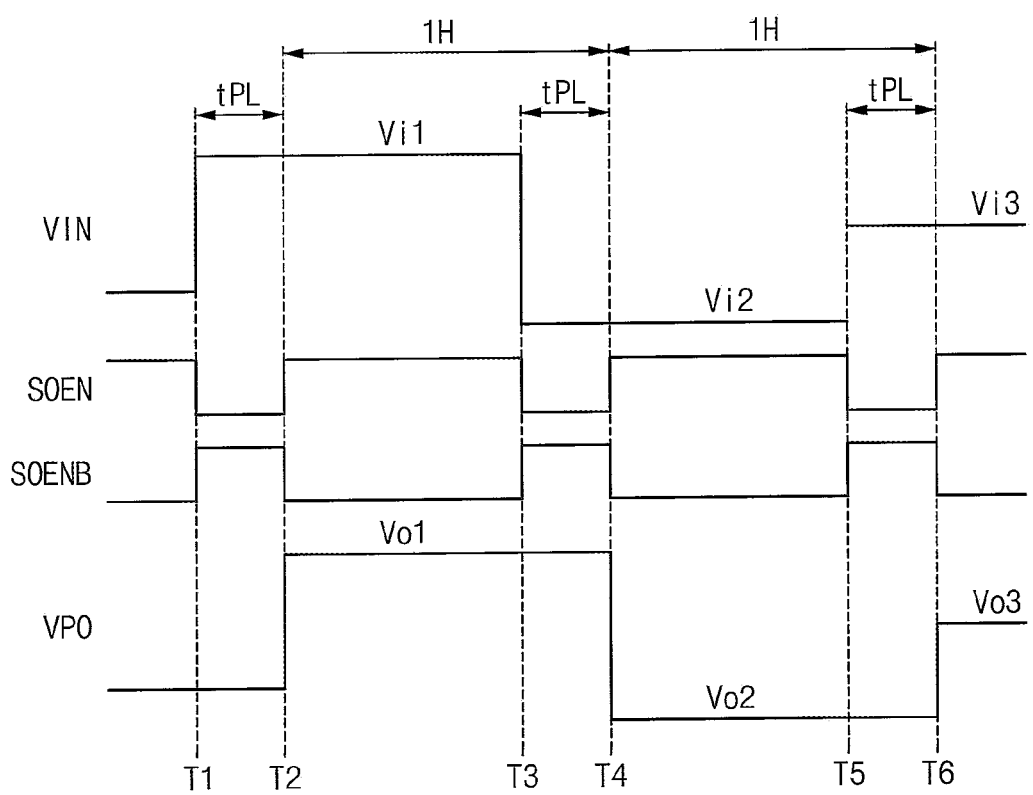
FIG. 14 is a timing diagram illustrating an operation of the output buffer circuit of FIG. 13.

FIG. 13 is a diagram illustrating an output buffer circuit according to some example embodiments, and FIG. 14 is a timing diagram illustrating an operation of the output buffer circuit of FIG. 13.

Referring to FIG. 13, an output buffer circuit 14 may include an output path circuit 304 and a feedback path circuit 404. The operational amplifier 100 and the slew rate compensating circuit 200 as described above are omitted in FIG. 13. The output buffer circuit 14 may or may not include operational amplifier 100 and/or the slew rate compensating circuit 200.

The output path circuit 304 may include an output switch SWO, and the feedback path circuit 404 may include a feedback switch SWF and a feedback control switch SWC. The specific configurations of the output path circuit 304 and the feedback path circuit 404 are omitted in FIG. 13, which may be implemented variously.

The output switch SWO is connected between the an amplifier output node NAO generating the amplifier output voltage signal VAO and the output pad PDO, and the output switch SWO is turned on in response to an output enable signal SOEN.

The feedback switch SWF is connected between a feedback output node NFO generating the feedback voltage signal VFB and the output pad PDO, and the feedback switch SWF is turned on in response to the output enable signal SOEN.

The feedback control switch SWC is connected between the amplifier output node NAO and the feedback output node NFO, and the feedback control switch SWC is turned on in response to an inversion signal SOENB of the output enable signal SOEN.

Referring to FIG. 14, according to transitions of the voltage levels Vi1, Vi2 and Vi3 of the input voltage signal VIN, the voltage levels Vo1, Vo2 and Vo3 of the pad output voltage signal VPO may transition sequentially per unit period 1H. When the output buffer circuit is the source amplifier circuit included in a source driver of a display device, the unit period 1H may correspond to a row scan period for applying the source voltage or the pad output voltage signal VPO to each pixel of a selected row.

The output enable signal SOEN may be deactivated during a pre-latch period tPL corresponding to a second portion of the unit period 1H, and may be activated during an output period corresponding to a first portion of the unit period 1H. In contrast, the inversion signal SOENB may be activated during the pre-latch period tPL, and may be deactivated during the output period. FIG. 14 illustrates an example wherein the output enable signal SOEN and the inversion signal SOENB are activated in the logic high level, but the activation logic level is not limited thereto.

Referring to FIGS. 13 and 14, during the output period while the output enable signal SOEN is activated, the output switch SWO is turned on such that the output path circuit 304 electrically connects the amplifier output node NAO to the output pad PDO, and the feedback control switch SWC is turned off and the feedback switch SWF is turned on such the feedback path circuit 404 electrically connects the output pad PDO to the feedback output node NFO.

In contrast, during the pre-latch period tPL while the output enable signal SOEN is deactivated, the output switch SWO is turned off such that the output path circuit 304 electrically disconnects the amplifier output node NAO from the output pad PDO, and the feedback switch SWF is turned off and the feedback control switch SWC is turned on such the feedback path circuit 404 electrically connects the amplifier output node NAO to the feedback output node NFO.

As a result, the feedback path circuit 404 may generate the feedback voltage signal VFB based on the voltage signal VFBI on the feedback input node NFI while the output enable signal SOEN is activated, and the feedback path circuit 404 may generate the feedback voltage signal VFB based on the amplifier output voltage signal VAO on the amplifier output node NAO while the output enable signal SOEN is deactivated.

During the pre-latch period tPL, the output buffer circuit may output the pad output voltage signal VPO corresponding to the previous data (for example, the voltage level) of the input voltage signal VIN, and may simultaneously load the next data of the input voltage signal VIN in advance to the input terminal of the operational amplifier of the output buffer circuit. The output switch SWO and the feedback switch SWF may turn off during the pre-latch period tPL so that the next data of the input voltage signal VIN may not affect the voltage level of the output pad PDO. In contrast, the feedback control switch SWC may turn on during the pre-latch period tPL to reduce the settling time of the amplifier output voltage signal VAO by providing the amplifier output voltage signal VAO to the slew rate compensating circuit.

Figure 15:
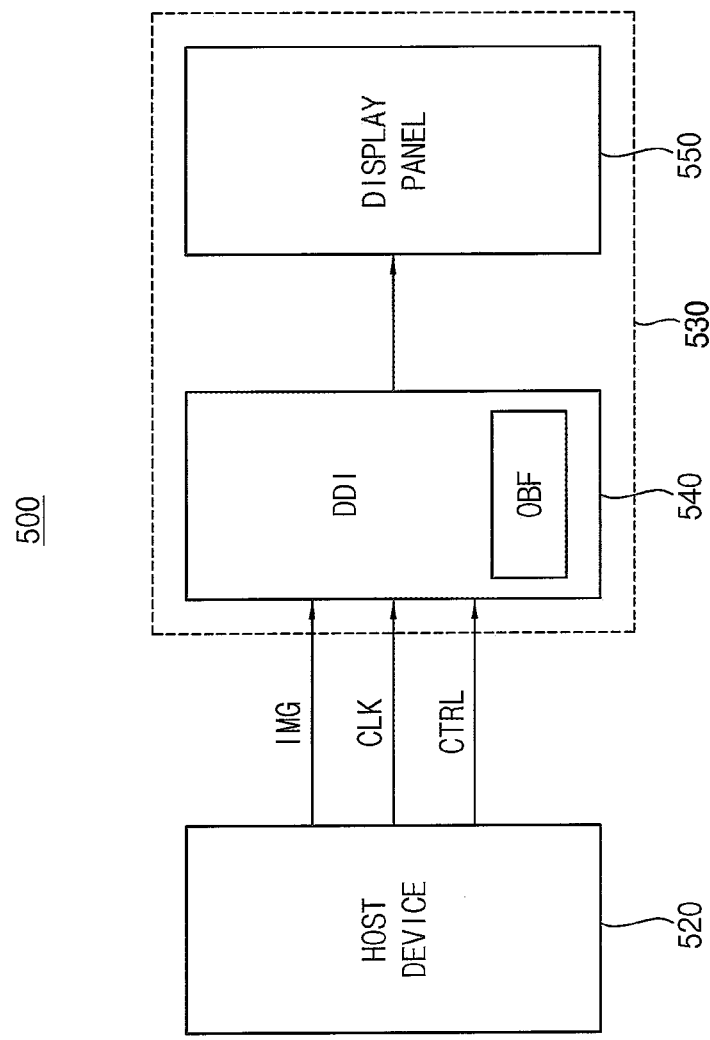
FIG. 15 is a block diagram illustrating a display system according to some example embodiments.

FIG. 15 is a block diagram illustrating a display system according to some example embodiments.

A display system 500 in FIG. 15 may be various electronic devices having a function of image display such as at least one of a mobile phone, a smartphone, a tablet personal computer (PC), a personal digital assistant (PDA), a wearable device, a potable multimedia player (PMP), a handheld device, a handheld computer, and so on.

Referring to FIG. 15, the display system 500 may include a host device 520 and a display device 530. The display device 530 may include a display driving integrated circuit DDI 540 and a display panel 550.

The host device 520 may control overall operations of the display system 500. The host device 500 may be or may include an application processor (AP), a baseband processor (BBP), a micro-processing unit (MPU), and so on. The host device 500 may provide image data IMG, a clock signal CLK, and control signals CTRL to the display device 530. For example, the image data IMG may include RGB pixel values and have a resolution of w*h where w is a number of pixels in a horizontal direction and h is a number of pixels in a vertical direction.

The control signals CTRL may include at least one of a command signal, a horizontal synchronization signal, a vertical synchronization signal, a data enable signal, and so on. For example, the image data IMG and the control signals CTRL may be provided, as a form of a packet, to the DDI 540 in the display device 530. The command signal may include control information, image information and/or display setting information. The image information may include, for example, a resolution of the input image data IMG. The display setting information may include, for example, panel information, a luminance setting value, and so on. For example, the host device 520 may provide, as the display setting information, information according to a user input or according to predetermined setting values.

The DDI 540 may drive the display panel 550 based on the image data IMG and the control signals CTRL. The DDI 540 may convert the digital image signal IMG to analog signals, and drive the display panel 550 based on the analog signals.

The DDI 540 may include a plurality of output buffer circuits OBF, such as at least one of those described above as described above with reference to FIGS. 1 through 14. According to some example embodiments, each buffer circuit OBF may increase the supply time of the compensation current using the feedback voltage signal VFB having the slew rate smaller than the slew rate of the amplifier output voltage signal VAO.

Figure 16:
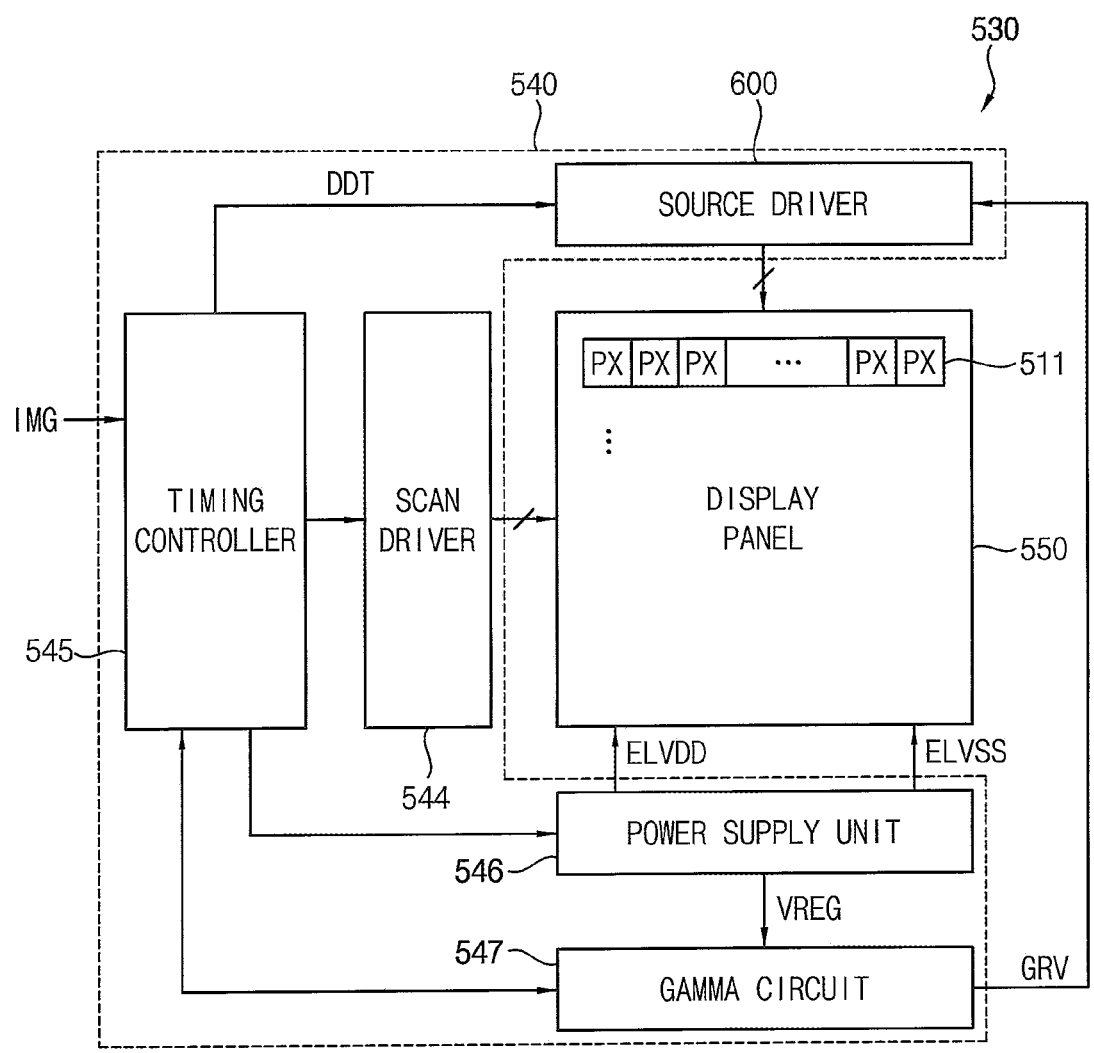
FIG. 16 is a block diagram illustrating a display device according to some example embodiments.

FIG. 16 is a block diagram illustrating a display device according to some example embodiments. FIG. 16 illustrates, as an example, an electroluminescence display device such as an OLED display device, and example embodiments are not limited to a specific kind of a display device.

Referring to FIG. 16, an electroluminescent display device 530 may include a display panel 550 including a plurality of pixel rows 511 and a DDI 530 that drives the display panel 550. The DDI 540 may include a data driver or a source driver 600, a scan driver 544, a timing controller 545, a power supply 546, and a gamma circuit 547.

The display panel 550 may be connected to the source driver 600 of the DDI 540 through a plurality of source lines and may be connected to the scan driver 544 of the DDI 540 through a plurality of scan lines. The display panel 550 may include the pixel rows 511. For example, the display panel 550 may include a plurality of pixels PX arranged in a matrix having a plurality of rows and a plurality of columns. One row of pixels PX connected to the same scan line may be referred to as one pixel row 511. In some example embodiments, the display panel 550 may be or may include a self-emitting display panel that emits light without the use of a back light unit. For example, the display panel 550 may be or may include an organic light-emitting diode (OLED) display panel.

Each pixel PX included in the display panel 550 may have various configurations according to a driving scheme of the display device 530. For example, the electroluminescent display device 530 may be driven with an analog and/or with a digital driving method. While the analog driving method produces grayscale using variable voltage levels corresponding to input data, the digital driving method produces grayscale using variable time duration in which the LED emits light. The analog driving method may be difficult to implement because the analog driving method uses a DDI that may be complicated to manufacture/fabricate if the display is large and/or has high resolution. The digital driving method, on the other hand, may readily accomplish high resolution through a simpler circuit structure. As the size of the display panel becomes larger and the resolution increases, the digital driving method may have more favorable characteristics over the analog driving method. The display device according to some example embodiments may be applied to both of the analog driving method and the digital driving method.

The source driver 600 may apply a data signal to the display panel 550 through the source lines based on display data DDT. The scan driver 544 may apply a scan signal to the display panel 550 through the scan lines.

As will be described below with reference to FIG. 17, the source driver 600 may include a plurality of output buffer circuits OBF such as t least one described above with reference to FIGS. 1 through 14. According to some example embodiments, each buffer circuit OBF may increase the supply time of the compensation current using the feedback voltage signal VFB having the slew rate smaller than the slew rate of the amplifier output voltage signal VAO.

The timing controller 545 may control the operation of the display device 530. The timing controller 545 may provide control signals to the source driver 600 and the scan driver 544 to control the operations of the display device 543. In some example embodiments, the source driver 600, the scan driver 544 and the timing controller 545 may be implemented as one integrated circuit (IC). In some example embodiments, the source driver 600, the scan driver 544 and the timing controller 545 may be implemented as two or more integrated circuits. A driving module including at least the timing controller 545 and the source driver 600 may be referred to as a timing controller embedded data driver (TED).

The timing controller 545 may receive the image data IMG and the input control signals from the host device 520 in FIG. 15. For example, the image data IMG may include red (R) image data, green (G) image data, and blue (B) image data. According to some example embodiments, the image data IMG may include white image data, magenta image data, yellow image data, cyan image data, and so on. The input control signals may include a master clock signal, a data enable signal, a horizontal synchronization signal, a vertical synchronization signal, and so on.

The power supply 546 may supply the display panel 550 with a high power supply voltage ELVDD and a low power supply voltage ELVSS. Alternatively or additionally, the power supply 546 may supply a regulator voltage VREG to the gamma circuit 547. The gamma circuit 547 may generate gamma reference voltages GRV based on the regulator voltage VREG. For example, the regulator voltage VREG may be or correspond to the high power supply voltage ELVDD or another voltage that is generated based on the high power supply voltage ELVDD.

Figure 17:
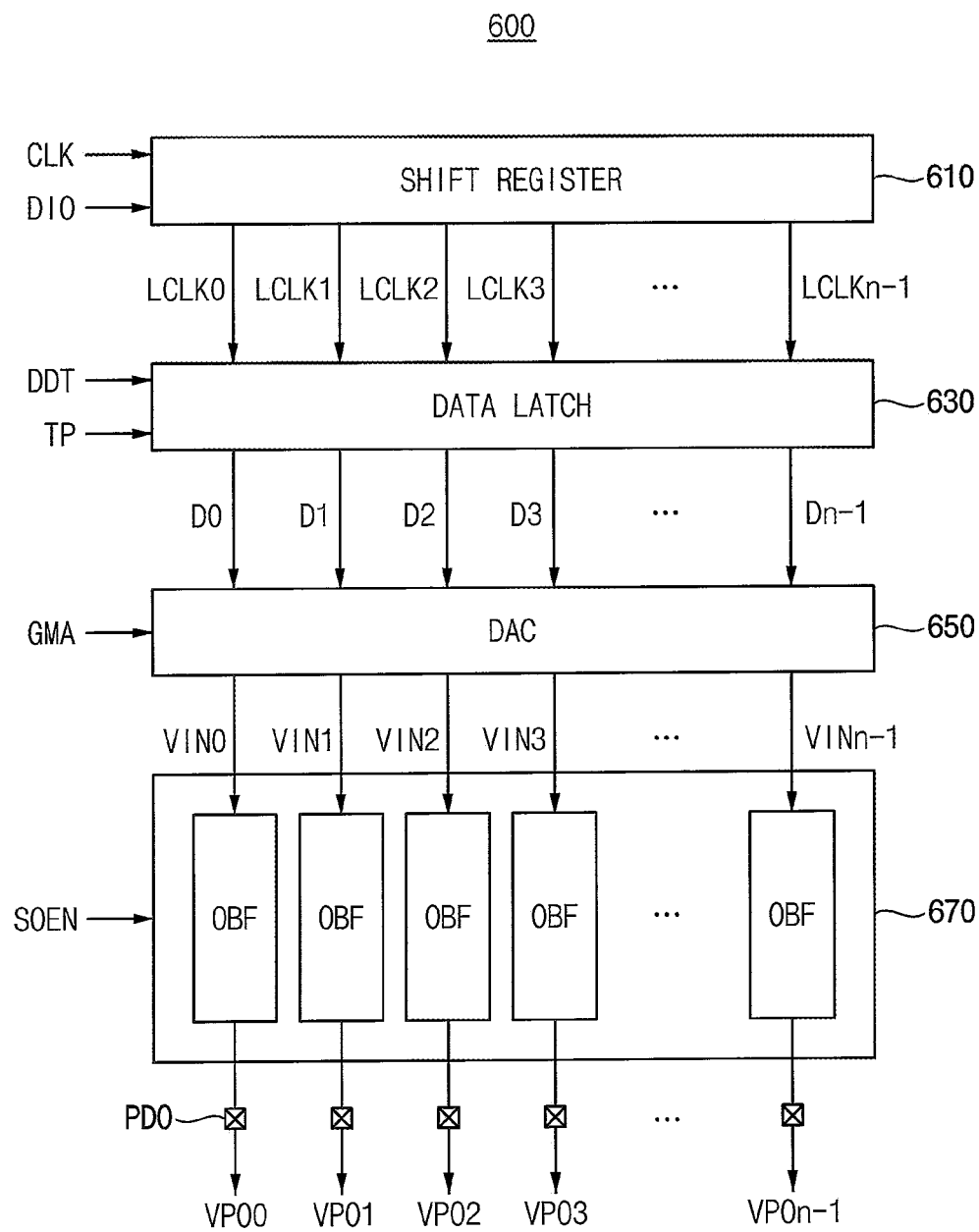
FIG. 17 is a block diagram illustrating a source driver of a display device according to some example embodiments.

FIG. 17 is a block diagram illustrating a source driver of a display device according to some example embodiments.

Referring to FIG. 17, a source driver 600 may include a shift register 610, a data latch 630, a digital-to-analog converter (DAC) 650, and an output buffer block 670.

The shift register 610 may receive a clock signal CLK and an input/output control signal DIO, and may generate a plurality of latch clock signals LCLK0 to LCLKn−1 based on the clock signal CLK. Each of the latch clock signals LCLK0 to LCLKn-1 may determine a latch point in time of the data latch 630 as a clock signal of a specific period.

The data latch 630 may store data DDT in response to the latch clock signals LCLK0 to LCLKn-1 provided by the shift register 610. The data latch 630 may output the stored data to the DAC 650 in response to a load signal TP. The data latch 630 may provide output signals D0 to Dn-1 in response to the load signal TP. The DAC 650 may generate input voltages signals VIN0 to VINn-1, which are analog signals corresponding to the output signals D0 to Dn-1 of the data latch 630, using a gray voltage GMA.

The output buffer block 670 may buffer the input voltages signals VIN0 to VINn-1 and may generate source driving signals, for example, the pad output voltage signals VPO0 to VPOn-1. The output buffer block 670 may include a plurality of output buffer circuits OBF respectively driving the source lines. Each output buffer circuit OBF may include an operational amplifier, a slew rate compensating circuit, an output path circuit and a feedback path circuit as described above.

The output buffer circuit OBF and the source driver 600 of the display device according to some example embodiments may increase the supply time of the compensation current using the feedback voltage signal having the slew rate lower than the slew rate of the amplifier output voltage signal. Through the increase of the supply time of the compensation current, the power consumption may be reduced and the performance of the output buffer circuit OBF and the source driver 600 may be enhanced.

Figure 18:
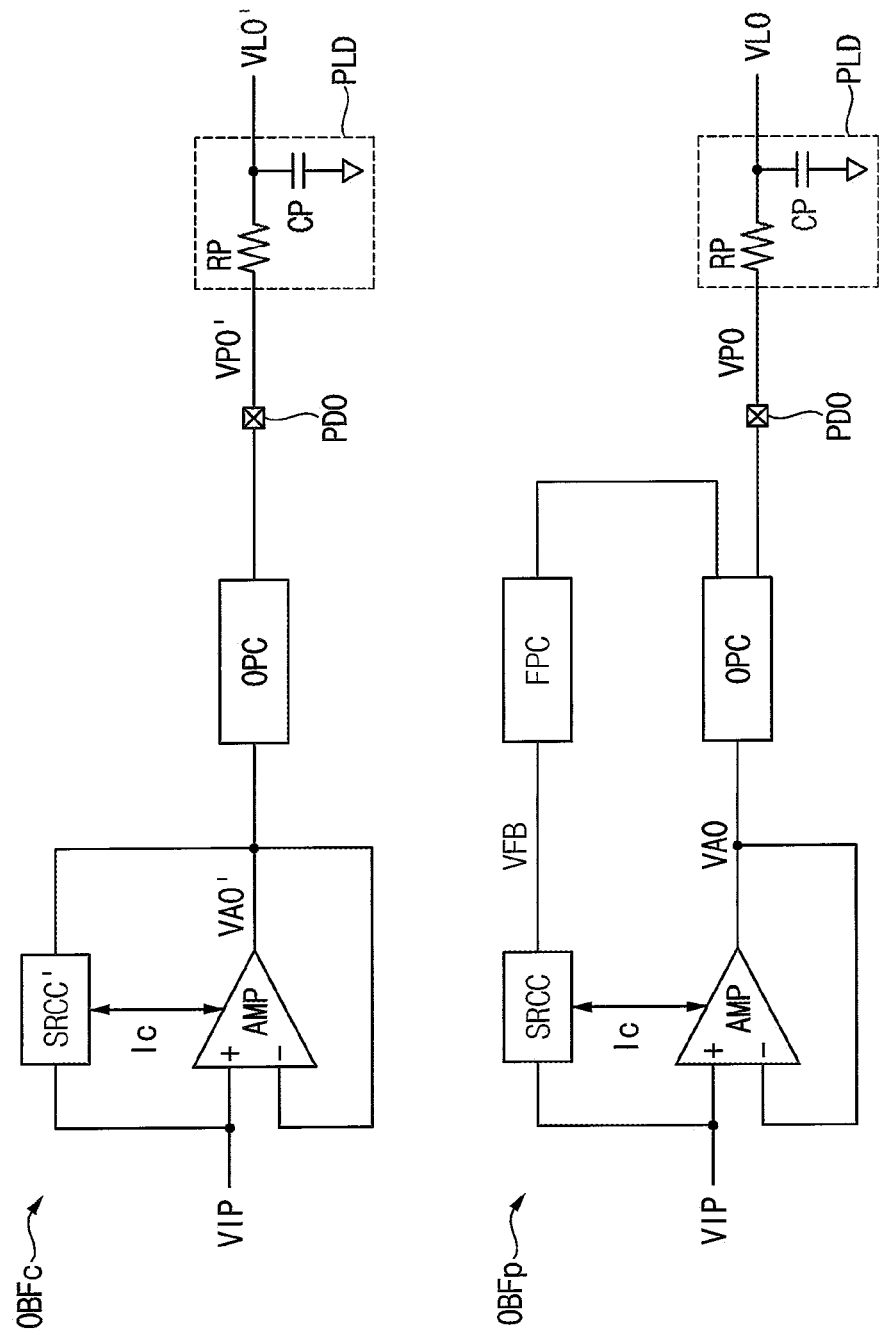
FIG. 18 is a diagram illustrating a general output buffer circuit and an output buffer circuit according to some example embodiments.

FIG. 18 is a diagram illustrating a general output buffer circuit and an output buffer circuit according to some example embodiments.

FIG. 18 illustrates a general output buffer OBFc including a slew rate compensating circuit SRCC' configured to generate a compensation current Ic by performing a slew rate compensating operation based on an amplifier output voltage signal VAO' and an output buffer OBFp according to some example embodiments including a slew rate compensating circuit SRCC configured to generate a compensation current Ic by performing a slew rate compensating operation based on a feedback voltage signal VFB having a slew rate smaller than a slew rate of the amplifier output voltage signal VAO. The operational amplifier AMP, the slew rate compensating circuits SRCC and SRCC', the output path circuit OPC and the feedback path circuit FPC are the same as described above and the repeated descriptions are omitted.

As illustrated in FIG. 18, a panel load PLD including a resistor RP and a capacitor CP may be connected to the output pad PDO. The panel load PLD may generate load output voltage signals VLO and VLO' by filtering the pad output voltage signals VPO and VPO', respectively.

Figure 19:
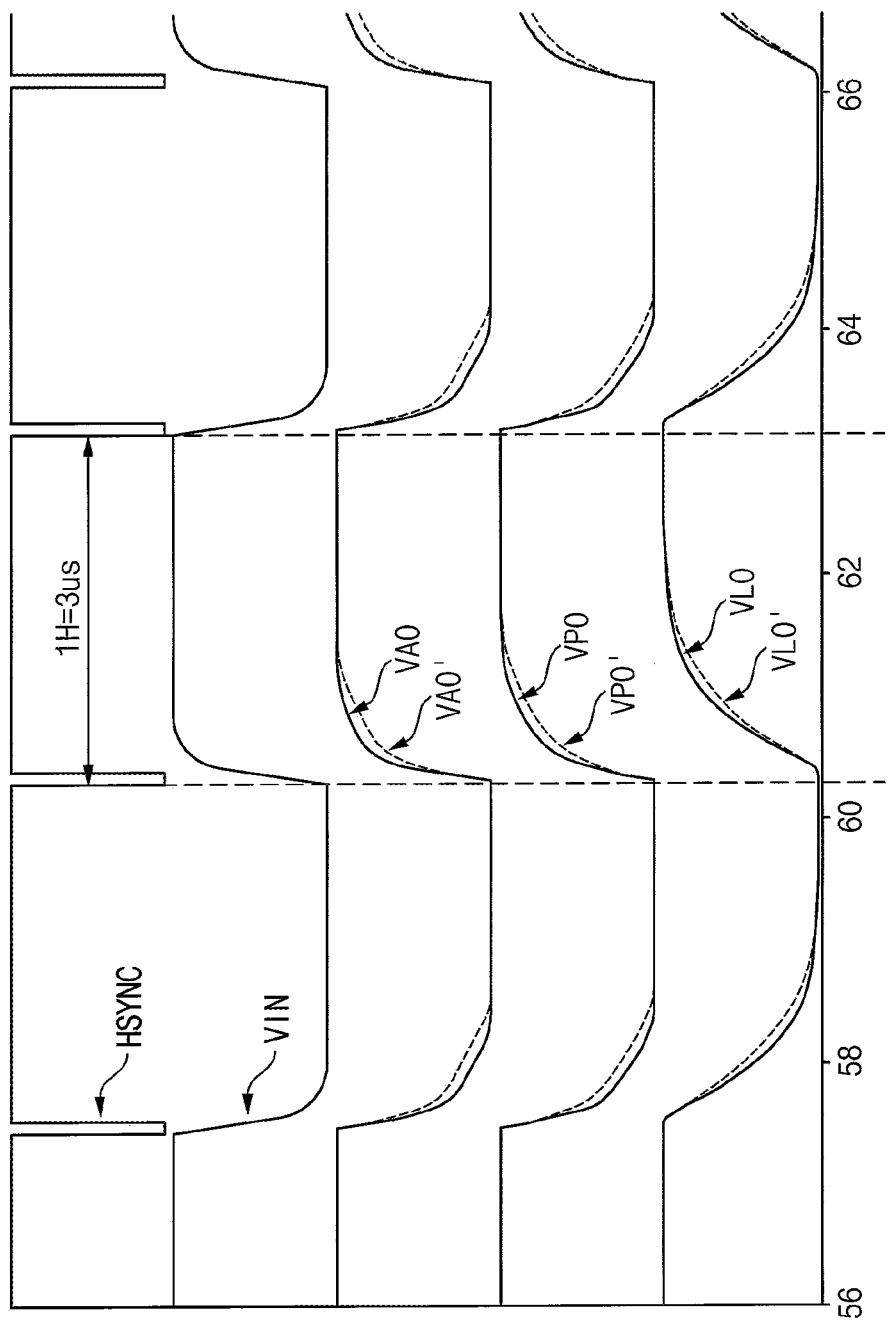
FIG. 19 is a timing diagram illustrating operations of the output buffer circuits of FIG. 18.

FIG. 19 is a timing diagram illustrating operations of the output buffer circuits of FIG. 18, and FIG. 20 is a diagram illustrating transition times and power consumption of the output buffer circuits of FIG. 18.

FIG. 19 illustrates a horizontal synchronization signal HSYNC corresponding to a row scan period 1H of about 3 us (micro-second), and waveforms of the amplifier output voltage signals VAO and VAO', the pad output voltage signals VPO and VPO' and the load output voltage signals VLO and VLO', which are measured with respect to the input voltage signal VIN transitioning per row scan period 1H between the higher voltage level and the lower voltage level.

As illustrated in FIG. 19, in comparison with the voltage signals VAO', VPO' and VLO' of the general output buffer circuit OBFc, the voltage signals VAO, VPO and VLO of the output buffer circuit OBFp according to some example embodiments may have the increased slew rates and the decreased transition times.

FIG. 20 illustrate the transition time that is, the rising time and the falling time of the voltage signals, the power consumption PWC1 of the source driver and the entire power consumption PWC2 of the display driving integrated circuit, which are measured with respect to the general output buffer circuit OBFc and the output buffer circuit OBFp according to some example embodiments. As illustrated in FIG. 20, in comparison with the general output buffer circuit OBFc, the transition time may be reduced by about 5% and the power consumption may be reduced by about 5.5% in the output buffer circuit OBFp according to some example embodiments.

Figure 21:
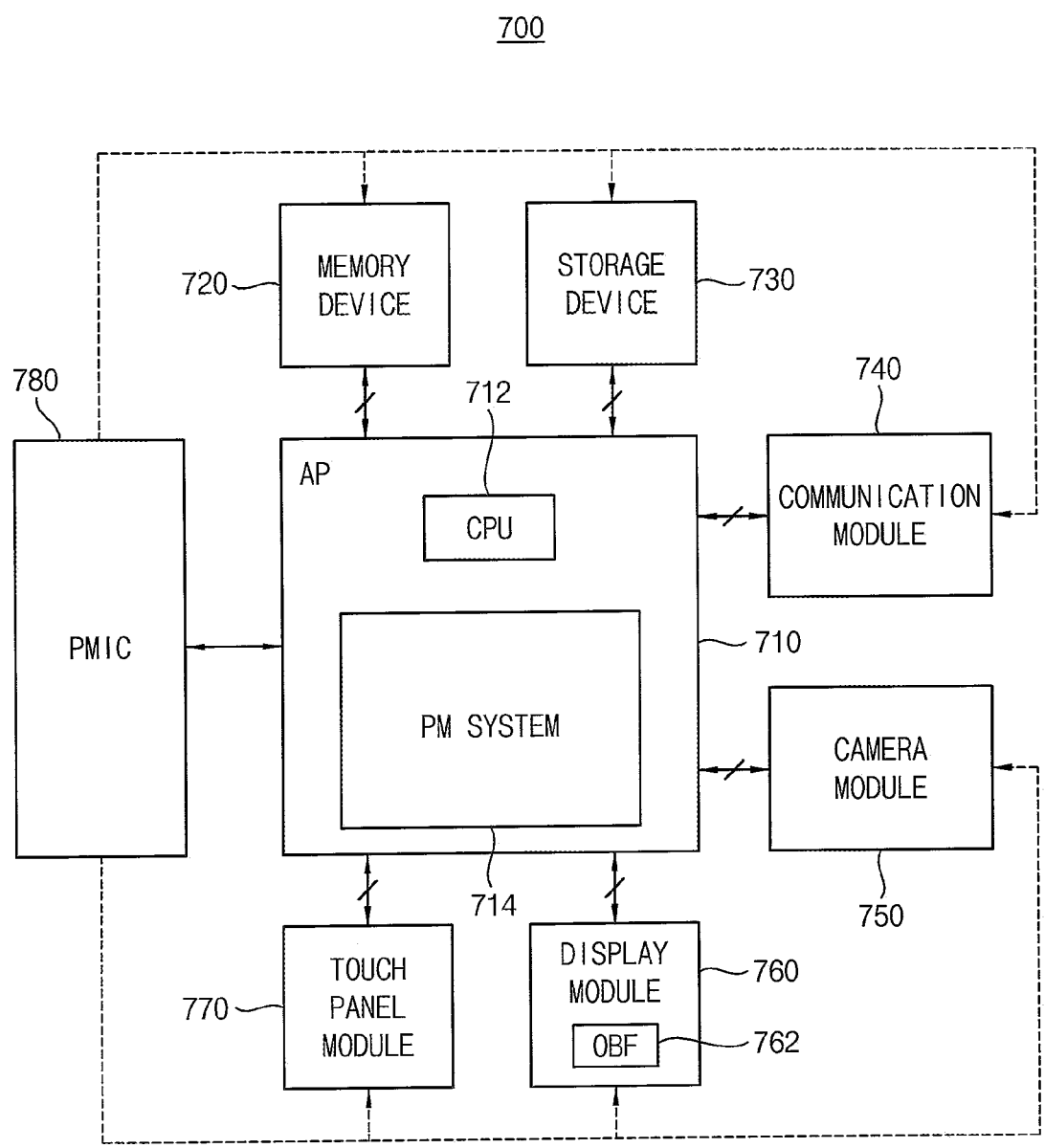
FIG. 21 is a block diagram illustrating a mobile device according to some example embodiments.

FIG. 21 is a block diagram illustrating a mobile device according to some example embodiments.

Referring to FIG. 21, a mobile device 700 includes a system on chip ("SoC") 710 and a plurality of functional modules 740, 750, 760 and 770. The mobile device 700 may further include a memory device 720, a storage device 730 and a power management device 780.

The SoC 710 controls overall operations of the mobile device 700. In some example embodiments, the SoC 710 controls the memory device 720, the storage device 730 and the plurality of functional modules 740, 750, 760 and 770, for example. The SoC 710 may be an application processor ("AP") that is included in the mobile device 700.

The SoC 710 may include a CPU 712 and a power management system PM SYSTEM 714. The memory device 720 and the storage device 730 may store data for operations of the mobile device 700. In some example embodiments, the memory device 720 may include a volatile memory device, such as at least one of dynamic random access memory ("DRAM"), a static random access memory ("SRAM"), a mobile DRAM, etc. In some example embodiments, the storage device 730 may include a nonvolatile memory device, such as at least one of an erasable programmable read-only memory ("EPROM"), an electrically EPROM ("EEPROM"), a flash memory, a phase change random access memory ("PRAM"), a resistance random access memory ("RRAM"), a nano floating gate memory ("NFGM"), a polymer random access memory ("PoRAM"), a magnetic random access memory ("MRAM"), a ferroelectric random access memory ("FRAM"), etc. In some example embodiments, the storage device 730 may further include at least one of a solid state drive ("SSD"), a hard disk drive ("HDD"), a CD-ROM, etc.

The functional modules 740, 750, 760 and 770 perform various functions of the mobile device 700. In some example embodiments, the mobile device 700 may include a communication module 740 that performs a communication function (e.g., at least one of a code division multiple access ("CDMA") module, a long term evolution ("LTE") module, a radio frequency (RF) module, an ultra-wideband ("UWB") module, a wireless local area network (WLAN) module, a worldwide interoperability for a microwave access ("WIMAX") module, etc.), a camera module 750 that performs a camera function, a display module 760 that performs a display function, a touch panel module 770 that performs a touch sensing function, etc., for example. In some example embodiments, the mobile device 700 may further include at least one of a global positioning system ("GPS") module, a microphone ("MIC") module, a speaker module, a gyroscope module, etc., for example. However, the functional modules 740, 750, 760, and 770 in the mobile device 700 are not limited thereto.

The power management device 780 may provide an operating voltage to the SoC 710, the memory device 720, the storage device 730 and the functional modules 740, 750, 760 and 770.

According to some example embodiments, the display module 760 includes an output buffer block 762, and the output buffer block 762 may include a plurality of output buffer circuits OBF to drive source lines of a display panel. Each output buffer circuit OBF may include an operational amplifier, a slew rate compensating circuit, an output path circuit and a feedback path circuit as described above.

Figure 22:
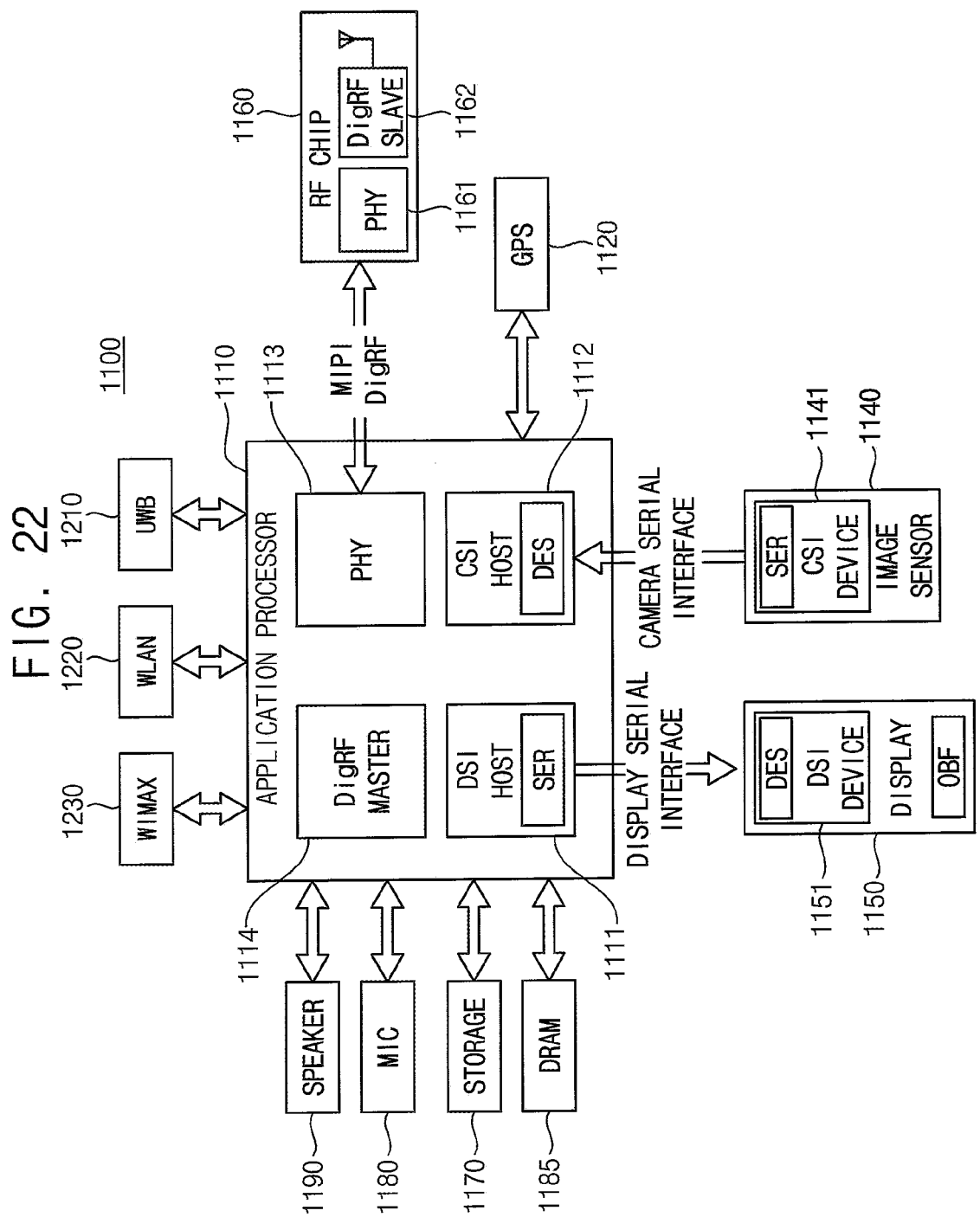
FIG. 22 is a block diagram illustrating a computing system according to some example embodiments.

FIG. 22 is a block diagram illustrating a computing system according to some example embodiments.

Referring to FIG. 22, a computing system 1100 may employ or support a MIPI interface, and may include an application processor 1110, a ToF sensor 1140 and a display device 1150. A CSI host 1112 of the application processor 1110 may perform a serial communication with a CSI device 1141 of the image sensor 1140 using a camera serial interface (CSI). In some example embodiments, the CSI host 1112 may include a deserializer DES, and the CSI device 1141 may include a serializer SER. A DSI host 1111 of the application processor 1110 may perform a serial communication with a DSI device 1151 of the display device 1150 using a display serial interface (DSI). In some example embodiments, the DSI host 1111 may include a serializer SER, and the DSI device 1151 may include a deserializer DES.

The computing system 1100 may further include a radio frequency (RF) chip 1160, which may include a physical layer PHY 1161 and a DigRF slave 1162. A physical layer PHY 1113 of the application processor 1110 may perform data transfer with the physical layer PHY 1161 of the RF chip 1160 using a MIN DigRF. The PHY 1113 of the application processor 1110 may interface and/or communicate with a DigRF MASTER 1114 for controlling the data transfer with the PHY 1161 of the RF chip 1160.

The computing system 1100 may further include a global positioning system (GPS) 1120, a storage device 1170, a microphone 1180, a DRAM 1185 and/or a speaker 1190. The computing system 1100 may communicate with external devices using an ultra-wideband (UWB) communication interface 1210, a wireless local area network (WLAN) communication interface 1220, a worldwide interoperability for microwave access (WIMAX) communication interface 1230, or the like. However, example embodiments are not limited to configurations or interfaces of the computing system 1000 and 1100 illustrated in FIG. 22.

According to some example embodiments, the source driver of the display device 1150 includes a plurality of output buffer circuits OBF to drive source lines of a display panel. Each output buffer circuit OBF may include an operational amplifier, a slew rate compensating circuit, an output path circuit and a feedback path circuit as described above.

As described above, the output buffer circuit and the source driver of the display device according to some example embodiments may increase the supply time of the compensation current using the feedback voltage signal having the slew rate lower than the slew rate of the amplifier output voltage signal. Through the increase of the supply time of the compensation current, the power consumption may be reduced and the performance of the output buffer circuit and the source driver may be enhanced.

Inventive concepts may be applied to any electronic devices and systems. For example, inventive concepts may be applied to systems such as at least one of a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a vehicle navigation system, a video phone, a monitoring system, an auto focusing system, a tracking system, a motion monitoring system, etc.

As used herein, terms such as "circuit" may indicate and/or refer to at least one electrical component, such as at least one active device and/or at least one passive device. Any or all of the elements disclosed above may include or be implemented in processing circuitry including active devices such as transistors and/or diodes, and/or passive devices including at least one of a resistor, a capacitor, an inductor, or a memristor, and/or hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The foregoing is illustrative of some example embodiments and is not to be construed as limiting thereof. Although a few example embodiments have been described, those of ordinary skill in the art will readily appreciate that many modifications are possible in the example embodiments without materially departing from inventive concepts.

What is claimed is:

1. An output buffer circuit comprising:
  an operational amplifier configured to generate an amplifier output voltage signal based on an input voltage signal and on a compensation current;
  a slew rate compensating circuit configured to generate the compensation current to increase a slew rate of the amplifier output voltage signal based on a difference between the input voltage signal and a feedback voltage signal;
  an output path circuit connected between the operational amplifier and an output pad, the output path circuit configured to transfer the amplifier output voltage signal to generate a pad output voltage signal through the output pad; and
  a feedback path circuit connected between the slew rate compensating circuit and a feedback input node that is on the output path circuit, the feedback path circuit configured to generate the feedback voltage signal.

2. The output buffer circuit of claim 1, wherein a slew rate of the feedback voltage signal is less than the slew rate of the amplifier output voltage signal.

3. The output buffer circuit of claim 1, wherein the feedback input node corresponds to the output pad, and the feedback path circuit is configured to generate the feedback voltage signal on the output pad based on the pad output voltage signal.

4. The output buffer circuit of claim 1, wherein the feedback input node corresponds to an output intermediate node inside the output path circuit, and the feedback path circuit is configured to generate the feedback voltage signal on the output intermediate node based on a voltage signal.

5. The output buffer circuit of claim 1, wherein the output path circuit includes:
an output switch connected between an amplifier output node generating the amplifier output voltage signal and a first output intermediate node, the output switch configured to turn on in response to an output enable signal;
an output conduction path connected between the first output intermediate node and a second output intermediate node; and
an output electrostatic discharge (ESD) resistor connected between the second output intermediate node and the output pad.

6. The output buffer circuit of claim 5, wherein the feedback path circuit is configured to generate the feedback voltage signal based on the pad output voltage signal that is on the output pad such that a slew rate of the feedback voltage signal is less than the slew rate of the amplifier output voltage signal.

7. The output buffer circuit of claim 5, wherein the feedback path circuit includes:
a feedback ESD resistor connected between the output pad and a first feedback intermediate node;
a feedback conduction path connected between the first feedback intermediate node and a second feedback intermediate node; and
a feedback switch connected between the second feedback intermediate node and a feedback output node generating the feedback voltage signal, the feedback switch configured to turn on in response to the output enable signal.

8. The output buffer circuit of claim 5, wherein the feedback path circuit is configured to generate the feedback voltage signal based on a voltage signal that is on the second output intermediate node such that a slew rate of the feedback voltage signal is less than the slew rate of the amplifier output voltage signal.

9. The output buffer circuit of claim 5, wherein the feedback path circuit includes:
a feedback conduction path connected between the second output intermediate node and a feedback intermediate node; and
a feedback switch connected between the feedback intermediate node and a feedback output node that is configured to generate the feedback voltage signal, the feedback switch configured to turn on in response to the output enable signal.

10. The output buffer circuit of claim 5, wherein the feedback path circuit is configured to generate the feedback voltage signal based on a voltage signal that is on the first output intermediate node such that a slew rate of the feedback voltage signal is less than the slew rate of the amplifier output voltage signal.

11. The output buffer circuit of claim 5, wherein the feedback path circuit includes:
a feedback switch connected between the first output intermediate node and a feedback output node that is configured to generate the feedback voltage signal, the feedback switch configured to turn on in response to the output enable signal.

12. The output buffer circuit of claim 1, wherein the output path circuit includes,
an output switch connected between the output pad and an amplifier output node that is configured to generate the amplifier output voltage signal, the output switch configured to turn on in response to an output enable signal, and wherein the feedback path circuit includes,
a feedback switch connected between the output pad and a feedback output node that is configured to generate the feedback voltage signal, the feedback switch configured to turn on in response to the output enable signal, and
a feedback control switch connected between the amplifier output node and the feedback output node, the feedback control switch configured to turn on in response to an inversion signal of the output enable signal.

13. The output buffer circuit of claim 12, wherein the feedback path circuit is configured to generate the feedback voltage signal based on a voltage signal on the feedback input node while the output enable signal is activated, and the feedback path circuit is configured to generate the feedback voltage signal based on the amplifier output voltage signal on the amplifier output node while the output enable signal is deactivated.

14. The output buffer circuit of claim 12, wherein, while the output enable signal is activated, the output switch is configured to turn on such that the output path circuit electrically connects the amplifier output node to the output pad, and
while the output enable signal is activated, the feedback control switch is configured to turn off and the feedback switch is configured to turn on such the feedback path circuit electrically connects the output pad to the feedback output node.

15. The output buffer circuit of claim 12, wherein, while the output enable signal is deactivated, the output switch is configured to turn off such that the output path circuit electrically disconnects the amplifier output node from the output pad, and
while the output enable signal is deactivated, the feedback switch is configured to turn off and the feedback control switch is configured to turn on such the feedback path circuit electrically connects the amplifier output node to the feedback output node.

16. The output buffer circuit of claim 1, wherein the slew rate compensating circuit includes:
a comparator circuit configured to compare the input voltage signal and the feedback voltage signal to generate a first current corresponding to a difference between the input voltage signal and the feedback voltage signal;
a pull-up compensation current generating circuit configured to perform a current-mirror operation on the first current to generate a pull-up compensation current that reduces a transition time of a rising edge of the amplifier output voltage signal; and
a pull-down compensation current generating circuit configured to perform a current-mirror operation on the first current to generate a pull-down compensation current that reduces a transition time of a falling edge of the amplifier output voltage signal.

17. The output buffer circuit of claim 16, wherein the comparator circuit includes:
an NMOS transistor having a gate to which the input voltage signal is applied, a source to which the feedback voltage signal is applied, and a drain connected to the pull-up compensation current generating circuit; and a PMOS transistor having a gate to which the input voltage signal is applied, a source to which the feedback voltage signal is applied, and a drain connected to the pull-down compensation current generating circuit.

18. The output buffer circuit of claim 17, wherein, while the difference between the input voltage signal and the feedback voltage signal is greater than a threshold voltage of the NMOS transistor, the NMOS transistor is turned on and the PMOS transistor is turned off such that the slew rate compensating circuit provides the pull-up compensation current to the operational amplifier, and wherein, while the difference between the input voltage signal and the feedback voltage signal is less than a threshold voltage of the PMOS transistor, the PMOS transistor turns on and the NMOS transistor turns off such that the slew rate compensating circuit provides the pull-down compensation current to the operational amplifier.

19. A source driver of a display device, comprising:

a plurality of output buffer circuits configured to drive source lines of a display panel, each of plurality of output buffer circuits configured to generate an amplifier output voltage signal based on an input voltage signal and on a compensation current, to generate a feedback voltage signal having a slew rate less than a slew rate of the amplifier output voltage signal, and to generate the compensation current to increase the slew rate of the amplifier output voltage signal, the increase based on a difference between the input voltage signal and the feedback voltage signal.

20. A source driver of a display device, comprising:

a shift register configured to generate a plurality of latch clock signals based on a clock signal and on an input-output control signal;

a data latch configured to store data in response to the plurality of latch clock signals and to output a plurality of digital input signals corresponding to the data in response to a load signal;

a digital-to-analog converter configured to generate a plurality of input voltage signals corresponding to the plurality of digital inputs signals, the generating the plurality of input voltage signals using gray voltages; and a plurality of output buffer circuits configured to buffer the plurality of input voltage signals to drive source lines of a display panel, each of the buffer circuits comprising, an operational amplifier configured to generate an amplifier output voltage signal based on each of the input voltage signals and on a compensation current, a slew rate compensating circuit configured to generate the compensation current to increase a slew rate of the amplifier output voltage signal based on a difference between each of the input voltage signals and a feedback voltage signal, an output path circuit connected between the operational amplifier and an output pad, the output path circuit configured to transfer the amplifier output voltage signal to generate a pad output voltage signal through the output pad, and a feedback path circuit connected between the slew rate compensating circuit and a feedback input node that is on the output path circuit, the feedback path circuit configured to generate the feedback voltage signal.

* * * * *